(12) United States Patent
Nakayama

(10) Patent No.: US 9,340,867 B2
(45) Date of Patent: May 17, 2016

(54) OXIDE SINTERED BODY AND TABLETS OBTAINED BY PROCESSING SAME

(75) Inventor: Tokuyuki Nakayama, Ichikawa (JP)

(73) Assignee: SUMITOMO METAL MINING CO., LTD., Tokyo (JP)

(*) Notice: Subject to any disclaimer, the term of this patent is extended or adjusted under 35 U.S.C. 154(b) by 148 days.

(21) Appl. No.: 13/979,682

(22) PCT Filed: Jan. 19, 2012

(86) PCT No.: PCT/JP2012/051039
§ 371 (c)(1),
(2), (4) Date: Jul. 15, 2013

(87) PCT Pub. No.: WO2012/105323
PCT Pub. Date: Aug. 9, 2012

(65) Prior Publication Data
US 2013/0299753 A1  Nov. 14, 2013

(30) Foreign Application Priority Data

Feb. 4, 2011  (JP) ................ 2011-022256

(51) Int. Cl.
*H01B 1/02* (2006.01)
*C23C 14/34* (2006.01)
(Continued)

(52) U.S. Cl.
CPC .............. *C23C 14/3407* (2013.01); *C04B 35/01* (2013.01); *C04B 35/62675* (2013.01);
(Continued)

(58) Field of Classification Search
CPC ...... C04B 35/01; C04B 35/64; C04B 35/453; H01B 1/08
USPC .............................. 252/519.1, 520.5; 257/72
See application file for complete search history.

(56) References Cited

U.S. PATENT DOCUMENTS

2003/0218153 A1  11/2003  Abe
2004/0040414 A1  3/2004  Abe
(Continued)

FOREIGN PATENT DOCUMENTS

EP    1734150 A1 * 12/2006 .............. C04B 35/01
JP    08-232060 A   9/1996
(Continued)

OTHER PUBLICATIONS

"Technology of a Transparent Conductive OXide Thin-Films ( The Second Revised Version)", Ohmsha, ltd., Dec. 20, 2006, pp. 243-250.
(Continued)

*Primary Examiner* — Khanh Tuan Nguyen
(74) *Attorney, Agent, or Firm* — Westerman, Hattori, Daniels & Adrian, LLP

(57) ABSTRACT

The present invention discloses a tablet for ion plating, which is capable of providing high speed film formation of a transparent conductive film suitable for a solar cell, and continuing film formation without generating crack, fracture or splash; and an oxide sintered body for obtaining the same. The oxide sintered body etc. comprising indium oxide as a main component, and tungsten as an additive element, content of tungsten being 0.001 to 0.15, as an atomic ratio of W/(In+W), characterized in that said oxide sintered body is mainly composed of a crystal grain (A) composed of the indium oxide phase with a bixbyite type structure, where tungsten does not make a solid solution, and a crystal grain (B) composed of the indium oxide phase with a bixbyite type structure, where tungsten does not make a solid solution, and has a density of 3.4 to 5.5 g/cm$^3$.

8 Claims, 2 Drawing Sheets

(51) Int. Cl.
*C04B 35/01* (2006.01)
*C04B 35/626* (2006.01)
*H01L 31/0224* (2006.01)
*H01L 31/032* (2006.01)
*H01B 1/08* (2006.01)
*H01L 51/44* (2006.01)

(52) U.S. Cl.
CPC ....... *C04B35/62695* (2013.01); *C23C 14/3414* (2013.01); *H01B 1/08* (2013.01); *H01L 31/022466* (2013.01); *H01L 31/032* (2013.01); *C04B 2235/326* (2013.01); *C04B 2235/3232* (2013.01); *C04B 2235/3244* (2013.01); *C04B 2235/3256* (2013.01); *C04B 2235/3258* (2013.01); *C04B 2235/3286* (2013.01); *C04B 2235/5436* (2013.01); *C04B 2235/604* (2013.01); *C04B 2235/6562* (2013.01); *C04B 2235/6565* (2013.01); *C04B 2235/6585* (2013.01); *C04B 2235/6586* (2013.01); *C04B 2235/76* (2013.01); *C04B 2235/77* (2013.01); *C04B 2235/80* (2013.01); *H01L 51/442* (2013.01); *H01L 2251/308* (2013.01)

(56) References Cited

U.S. PATENT DOCUMENTS

| | | |
|---|---|---|
| 2005/0224766 A1 | 10/2005 | Abe |
| 2006/0099140 A1 | 5/2006 | Abe |
| 2006/0219988 A1 | 10/2006 | Abe |
| 2006/0284143 A1 | 12/2006 | Abe |
| 2007/0170434 A1* | 7/2007 | Inoue et al. ............... 257/72 |

FOREIGN PATENT DOCUMENTS

| | | |
|---|---|---|
| JP | 2002-256424 A | 9/2002 |
| JP | 2004-006221 A | 1/2004 |
| JP | 2004-091265 A | 3/2004 |
| JP | 2005-268113 A | 9/2005 |
| JP | 2006-347807 A | 12/2006 |
| JP | 2008-028133 A | 2/2008 |

OTHER PUBLICATIONS

International Search Report for PCT/JP2012/051039, Mailing Date of Apr. 17, 2012.
Written Opinion for PCT/JP2012/051039, Mailing Date of Apr. 17, 2012.
Extended European Search Report dated Apr. 2, 2015, issued in corresponding European Patent Application No. 12742512.2 (5 pages).

* cited by examiner

OXIDE SINTERED BODY AND TABLETS OBTAINED BY PROCESSING SAME

TECHNICAL FIELD

The present invention relates to an oxide sintered body and a tablet obtained by processing the same, and in more detail, the present invention relates to a tablet for ion plating, which is capable of providing high speed film formation of a transparent conductive film suitable for a solar cell, and continuing film formation without generating crack, fracture or splash; and an oxide sintered body for obtaining the same.

BACKGROUND ART

A transparent conductive film, because of having high conductivity and high transmittance in a visible light region, has been utilized in an electrode or the like, for a solar cell or a liquid crystal display element, and other various light receiving elements, as well as a heat ray reflection film for an automotive window or construction use, an antistatic film, and a transparent heat generator for various anti-fogging for a refrigerator showcase and the like.

As a well known practical transparent conductive film, there has been included a thin film of tin oxide ($SnO_2$)-type, zinc oxide (ZnO)-type, indium oxide ($In_2O_3$)-type. As the tin oxide-type, the one containing antimony as a dopant (ATO), or the one containing fluorine as a dopant (FTO) has been utilized, and as the zinc oxide-type, the one containing aluminum as a dopant (AZO), or the one containing gallium as a dopant (GZO) has been utilized. However, the transparent conductive film most widely used industrially is the indium oxide-type. Among them, indium oxide containing tin as a dopant is called an ITO (Indium-Tin-Oxide) film, and has been utilized widely, because, in particular, a film with low resistance can be obtained easily.

The transparent conductive film with low resistance is suitably used widely in a surface element or a touch panel or the like, of such as for a solar cell, a liquid crystal, an organic electroluminescence and an inorganic electroluminescence. As a production method for the above various transparent conductive films, a sputtering method, a vacuum deposition method, or an ion plating method has been known.

A sputtering method among them is an effective method in film formation of a material with low vapor pressure, or in requiring precise film thickness control, and because of very simple and easy operation thereof, it is widely utilized industrially. In a sputtering method, a target for sputtering is used as a raw material of a thin film. The target is a solid material containing a constituent element of the thin film to be formed, and a sintered body such as a metal, a metal oxide, a metal nitride, a metal carbide, or in certain cases, a single crystal is used. In this method, in general, after making high vacuum once with a vacuuming apparatus, rare gas (argon or the like) is introduced, and under a gas pressure of about 10 Pa or lower, a substrate is set as an anode and a target is set as a cathode to generate glow discharge between them and generate argon plasma, and argon cations in the plasma are collided with the target of the cathode, and particles of the target component flicked thereby are deposited on the substrate to form a film.

The sputtering method is classified, based on a generation method for argon plasma, and the one using high frequency plasma is called a high frequency sputtering method, while the one using direct-current plasma is called a direct-current sputtering method. In general, the direct-current sputtering method provides faster film formation speed, lower cost of power source facility, and simpler film formation operation, as compared with the high frequency sputtering method, and by these reasons, it has been used widely industrially.

However, in recent years, an ion plating method has been noticed as a method which is capable of forming a transparent conductive film having equivalent or better quality as compared with a direct current sputtering method. The ion plating method is a method for evaporating a raw material called a tablet (or a pellet) composed of a metal or a metal oxide, by resistance heating or electron-beam heating, under a pressure of about $10^{-3}$ to $10^{-2}$ Pa, and further activating the evaporated substance using plasma along with reaction gas (oxygen) to deposit it on a substrate. In particular, an ion plating method using a pressure-gradient-type plasma gun utilizes direct-current arc discharge of a large current, therefore it is capable of generating high density plasma having characteristics that evaporation speed of a sample is higher as compared with a conventional direct-current sputtering method. Conventionally, there has been a defect that uniform film formation onto a large area substrate is difficult, caused by irregular distribution of film quality or film thickness, however, it has been overcome by a technology adjusting a magnetic field at the vicinity of a Haas where plasma beams inject, of, for example, PATENT LITERATURE 1, by which uniform film formation onto a large area substrate has become possible.

It is preferable to use the oxide sintered body, as a tablet for ion plating to be used in formation of the transparent conductive film, similarly as in the target for sputtering, and using this, the transparent conductive film having a constant film thickness and constant characteristics can be produced stably. It should be noted that the tablet for ion plating uses the one having a low sintering density of about 70%, for example, as described in the NON PATENT LITERATURE 1, to avoid fracture caused by electron beam heating, different from the tablet for sputtering. The case of too high or too low density tends to generate crack or fracture onto the oxide sintered body, leading to damage. In addition, the oxide sintered body tablet is required to uniformly evaporate, and thus it is preferable that a substance having stable chemical bond and being difficult to evaporate does not exist together with a substance which is easy to evaporate and present as a main phase.

In addition, a method for forming a thin film by vaporization and ionization of the oxide sintered body, which is an evaporation material (tablet), by an ion plating method, has a problem of generating splash of the evaporation material in heating, leading to a pin-hole defect in a deposited film, caused by scattering particles. "Splash" means the following phenomenon. That is, when the evaporation material is heated by irradiation of plasma beams or electron beams in vacuum, it is vaporized at a time when certain temperature is reached, and it initiates uniform evaporation in an atomic state. "Splash" means a phenomenon where visible sized splash having a size of about several μm to 1000 μm, jumps out of the evaporation material, by being mixed in uniform evaporation gas, and collides onto the deposited film, in this occasion. Generation of this phenomenon causes to incur the pinhole defect in the deposited film by collision of the splash, which not only impairs uniformity of the deposited film but also significantly deteriorates performance as a conductive film.

As described above, use of an oxide target, which is difficult to generate splash of the evaporation material in heating, and does not generate the pinhole defect in the deposited film by the scattering particles, can be said important, to form the transparent conductive film of an oxide such as ITO, by an ion plating method.

Now, in recent years, a solar cell module using the transparent conductive film different from the ITO has been proposed. In PATENT LITERATURE 2, there has been proposed a solar cell module superior in weatherability, and described that by using indium oxide added with tungsten as the transparent conductive film, arithmetic average roughness (Ra) can be deceased, and electric conductivity and light transmission property can be enhanced in addition to weatherability, and described that, for example, by using a sintered body of $In_2O_3$ powder mixed with 3% by weight of $WO_3$ powder, as a target (a tablet or a pellet), the transparent conductive film was formed by an ion plating method. In PATENT LITERATURE 2, although it is said that the transparent conductive film composed of indium oxide added with tungsten formed by an ion plating method, is useful as the transparent conductive film for a solar cell module, there is no detailed description on a tablet composed of the evaporation material, which is the raw material thereof, that is, the oxide sintered body.

In PATENT LITERATURE 3, there has been proposed a sintered body target obtained by sintering mixed powder having an indium oxide as a main component, and containing tungsten within a range of 0.003 to 0.15, as tungsten/indium atomic ratio. However, PATENT LITERATURE 3 has only disclosed a high density sputtering target, having a uniform texture composed of the indium oxide phase with a bixbyite type structure, and a production method thereof, thinking that it is preferable that tungsten makes a solid solution by substitution at an indium site of indium oxide, and it is preferable that relative density is 90% or higher. That is, it is a high density sputtering target, therefore when it is used as a tablet for ion plating, it generates crack, fracture or splash, and thus desired film formation cannot be continued.

In PATENT LITERATURE 4, there has been proposed the oxide sintered body mainly composed of indium, containing tungsten and having a specific resistance of 1 kΩcm or smaller, or the oxide sintered body mainly composed of indium, containing tungsten and tin, having a specific resistance of 1 kΩcm or smaller, and it has been described desirable that content of tungsten is desirably 0.001 to 0.17 as W/In atomic ratio, and further it has been described desirable that it is mainly composed of the indium oxide crystal phase with a bixbyite type structure, where tungsten is present as a solid solution and/or an indium tungstate compound phase, and the crystal phase of tungsten oxide does not exist. In addition, also PATENT LITERATURE 4, similarly as PATENT LITERATURE 3, has described mainly a sputtering target, however, crack, fracture or splash cannot be suppressed, even if a high density sputtering target is used as the tablet for ion plating.

As described above, in conventional technology relating to the oxide sintered body containing indium and tungsten, there has not been studied sufficiently on prevention of crack, fracture or splash, in film formation by ion plating, which becomes important in mass production of a crystalline transparent conductive film, and thus there has been desired the advent of the oxide sintered body containing indium and tungsten, which has solved these problems.

CITATION LIST

Patent Literature

PATENT LITERATURE 1: JP-A-8-232060
PATENT LITERATURE 2: JP-A-2008-28133
PATENT LITERATURE 3: JP-A-2002-256424
PATENT LITERATURE 4: JP-A-2004-91265

Non Patent Literature

NON PATENT LITERATURE 1: "Technology of a transparent conductive film (the second Revised version)", Ohm-sha, Ltd., published on Dec. 20, 2006, pages 243 to 250

SUMMARY OF INVENTION

Technical Problem

In view of the above problems, it is an object of the present invention to provide a tablet for ion plating, which is capable of attaining prevention of crack, fracture or splash in high speed film formation of a crystalline transparent conductive film optimum for a device such as a solar cell; and an oxide sintered body optimum for obtaining the same.

Solution to Problem

The present inventors have studied in detail, to solve the above-described problems, on influence of a compositional phase and a texture of the oxide sintered body on production conditions such as film formation speed thereof, or generating crack, fracture or splash in ion plating, by preparing many oxide sintered body samples by changing the compositional phase and the texture of the oxide sintered body containing an indium oxide as a main component, and tungsten as an additive element, and forming the transparent conductive film by an ion plating method, by processing the sample to obtain an oxide tablet.

As a result, we have discovered that generation of crack, fracture or splash in ion plating generated conventionally can be suppressed, even when film formation speed is increased by increasing charging power in formation of the transparent conductive film, by using a tablet made of the oxide sintered body, (1) which contains the indium oxide as a main component, and tungsten as an additive element, wherein content of tungsten is 0.001 to 0.15 as an atomic ratio of W/(In+W), or further contains, as the additive element, at least one or more kinds of a metal element (M element) selected from a metal element group consisting of titanium, zirconium, hafnium, and molybdenum, wherein a total content of tungsten and the N element is 0.001 to 0.15 as an atomic ratio of (W+M)/(In+W+M), and also which is composed of (2) the crystal grain (A) composed of the indium oxide phase with a bixbyite type structure, where tungsten does not make a solid solution, and the crystal grain (B) composed of the indium oxide phase with a bixbyite type structure, where tungsten is present as a solid solution; or the crystal grain (A) composed of the indium oxide phase with a bixbyite type structure, where tungsten does not make a solid solution, the crystal grain (B) composed of the indium oxide phase with a bixbyite type structure, where tungsten is present as a solid solution and the crystal grain (C) composed of the indium tungstate compound phase, and also where density thereof is controlled in a range of 3.4 to 5.5 $g/cm^3$, and have thus completed the present invention.

That is, according to a first aspect of the present invention, there is provided an oxide sintered body comprising indium oxide as a main component, and tungsten as an additive element, content of tungsten being 0.001 to 0.15, as an atomic ratio of W/(In+W), characterized in that said oxide sintered body is mainly composed of a crystal grain (A) composed of the indium oxide phase with a bixbyite type structure, where tungsten does not make a solid solution, and a crystal grain (B) composed of the indium oxide phase with a bixbyite type structure, where tungsten is present as a solid solution, and has a density of 3.4 to 5.5 $g/cm^3$.

In addition, according to a second aspect of the present invention, in the first aspect, there is provided the oxide sintered body, characterized by further comprising, as the additive element, at least one or more kinds of a metal element (M element) selected from a metal element group consisting of titanium, zirconium, hafnium, and molybdenum, wherein a total content of tungsten and the M element is 0.001 to 0.15, as an atomic ratio of (W+M)/(In+W+M).

In addition, according to a third aspect of the present invention, in the first aspect, there is provided the oxide sintered body characterized in that the content of tungsten is 0.003 to 0.05, as an atomic ratio of W/(In+W).

In addition, according to a fourth aspect of the present invention, in the second aspect, there is provided the oxide sintered body characterized in that the total content of tungsten and the M element is 0.003 to 0.05, as an atomic ratio of (W+M)/(In+W+M).

In addition, according to a fifth aspect of the present invention, in the first aspect, there is provided the oxide sintered body characterized by further comprising a crystal grain (C) composed of an indium tungstate compound phase.

In addition, according to a sixth aspect of the present invention, in the first aspect, there is provided the oxide sintered body characterized by not comprising a crystal grain (D) composed of a tungsten oxide phase.

Still more, according to a seventh aspect of the present invention, there is provided a tablet obtained by processing the oxide sintered body in any of the first or the sixth aspects.

Advantageous Effects of Invention

Because the oxide sintered body of the present invention, containing indium and tungsten, has a content of tungsten in the oxide sintered body is 0.001 to 0.15, as an atomic ratio of W/(In+W), and is mainly composed of the crystal grain (A) composed of the indium oxide phase with a bixbyite type structure, where tungsten does not make a solid solution, and the crystal grain (B) composed of the indium oxide phase with a bixbyite type structure, where tungsten is present as a solid solution and also density is in a range of 3.4 to 5.5 g/cm$^3$ generation of crack, fracture or splash in ion plating can be suppressed, even when film formation speed is increased, in obtaining the oxide transparent conductive film by using a tablet processed said oxide sintered body. In this way, film formation speed can be increased as compared with a conventional method, and mass production of the transparent conductive film becomes possible.

As a result, the present invention can obtain the transparent conductive film containing indium and tungsten, and optimal for a solar cell or the like, and it is industrially extremely useful.

DESCRIPTION OF EMBODIMENTS

Figure 1:
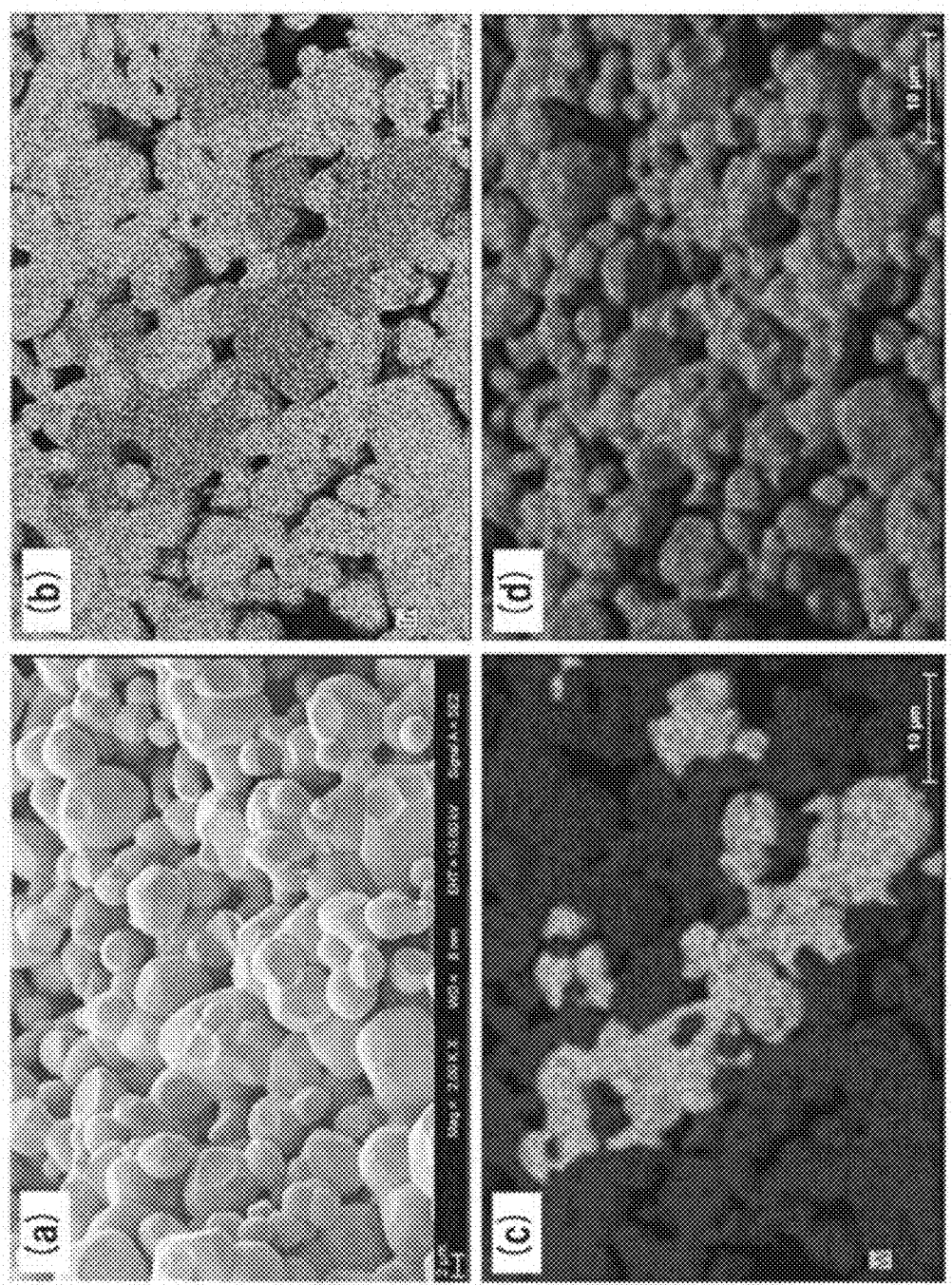
FIG. 1 is a secondary electron image along with surface analysis result of a texture of a crystal grain, obtained by texture observation, using SEM-EDS, of the cross-section of an oxide sintered body having an atomic ratio of W/(In+W) of 0.06 of the present invention.

Explanation will be given below in detail on the oxide sintered body of the present invention, the tablet for ion plating and the production method therefor, with reference to drawings.

1. The Oxide Sintered Body

The oxide sintered body of the present invention, containing an oxide of indium and tungsten, has a special phase structure and is largely classified into two kinds: the one having a content of tungsten of 0.001 to 0.15, as an atomic ratio of W/(In+W) (hereafter, this is referred to as a first oxide sintered body); and the one further containing the M element other than indium and tungsten, where a total content of tungsten and the M element is 0.001 to 0.15, as an atomic ratio of (W+M)/(In+W+M), and the M element is at least one or more kinds of an metal element selected from the metal element group consisting of titanium, zirconium, hafnium, and molybdenum (hereafter, this is referred to as a second oxide sintered body).

As described above, conventionally, the oxide sintered body mainly aiming at a target for sputtering has been proposed, in forming a transparent conductive film composed of oxides containing indium and tungsten, however, as for an ion plating method, there has not been investigated sufficiently, as for the oxide sintered body containing indium and tungsten to be a material thereof, on the compositional phase and the texture, or optimization of density etc. of said oxide sintered body. Therefore, it has been difficult to produce the transparent conductive film stably and in high speed, because suppression of crack, fracture or splash generating was impossible, even in trying to obtain the oxide transparent conductive film by an ion plating method using such an oxide sintered body. In the present invention, the oxide sintered body containing indium and tungsten has been investigated in detail, in view of the compositional phase and the texture thereof, to clarify influence on film formation speed of the oxide transparent conductive film, or on generating crack, fracture or splash in film formation by the ion plating method.

1) A First Oxide Sintered Body

The first oxide sintered body of the present invention contains indium and tungsten as an oxide, wherein content of tungsten is 0.001 to 0.15, as an atomic ratio of W/(In+W), and also it is mainly composed of the crystal grain (A) composed of the indium oxide phase with a bixbyite type structure, where tungsten does not make a solid solution, and the crystal grain (B) composed of the indium oxide phase with a bixbyite type structure, where tungsten is present as a solid solution; or the crystal grain (A) composed of the indium oxide phase with a bixbyite type structure, where tungsten does not make a solid solution, the crystal grain (B) composed of the indium oxide phase with a bixbyite type structure, where tungsten is present as a solid solution, and the crystal grain (C) composed of the indium tungstate compound phase, where density thereof is 3.4 to 5.5 g/cm$^3$.

In the present description, "mainly composed of" means that in many cases, it is mainly composed of the crystal grain (A) and the crystal grain (B), however, there may the case of containing, other than these, the crystal grain (C), and the crystal grain (D) may further be contained thereto.

(a) Composition

For the first oxide sintered body of the present invention, it is necessary that the tungsten content is 0.001 to 0.15, as an atomic ratio of W/(In+W). The tungsten content is preferably 0.002 to 0.10, and more preferably 0.003 to 0.05. Within this range, by processing it to a tablet for ion plating, a crystalline transparent conductive film having low specific resistance and high transmittance at near infrared region, suitable for a solar cell, can be obtained.

In the case where the tungsten content is below 0.001, as an atomic ratio of W/(In+W), carrier electrons minimum required are not generated in the transparent conductive film formed using this, and is thus not preferable. For the transparent conductive film to show low specific resistance by high mobility, a small amount of carrier electrons generated by doping of tungsten is needed, in addition to carrier electrons generated by oxygen deficiency. It should be noted that because tin has extremely high generation effect of carrier electrons, when added to indium oxide, tin should not be contained. It is not preferable to contain also elements such as silicon, germanium, antimony, bismuth and tellurium, by the same reason, although the above effect thereof is a little inferior, as compared with tin. However, as for unavoidable impurities in an amount of such a degree as not to influence on the above characteristics, it does not apply.

On the other hand, in the case where tungsten content of the oxide sintered body is over 0.10, as an atomic ratio of W/(In+W), in the crystalline transparent conductive film to be formed, excess W behaves as scattering centers of impurity ions, which adversely increases specific resistance, thus making difficult to be adopted as a transparent electrode of a solar cell.

(b) A Generation Phase and Morphology Thereof

A texture of the first oxide sintered body is mainly composed of the crystal grain (A) composed of the indium oxide phase with a bixbyite type structure, where tungsten does not make a solid solution, and the crystal grain (B) composed of the indium oxide phase with a bixbyite type structure, where tungsten is present as a solid solution, or composed of the crystal grain (A) composed of the indium oxide phase with a bixbyite type structure, where tungsten does not make a solid solution, the crystal grain (B) composed of the indium oxide phase with a bixbyite type structure, where tungsten is present as a solid solution and the crystal grain (C) composed of the indium tungstate compound phase.

The first oxide sintered body contains the crystal grain (B) composed of the indium oxide phase, where tungsten is present as a solid solution, as one of composition texture. As described above, the tablet for ion plating is required to have a low sintering density of about 70% relative to a theoretical density of 7.12 g/cm$^3$, to avoid damage caused by, for example, electron beam heating. Increase in ratio of the crystal grain (B) composed of the indium oxide phase, where tungsten is present as a solid solution, tends to suppress sintering density to about 70%, and thus it is effective also in suppressing damage in crack, fracture or splash.

However, presence of only the crystal grain (B) composed of the indium oxide phase with a bixbyite type structure, where tungsten is present as a solid solution, provides poor sintering performance and has a problem of decreasing strength of the sintered body. Presence of only the crystal grain (B) decreases density of the sintered body, therefore shock by electron beams heating can be alleviated to a certain degree, however, strength of the sintered body, which is required to withstand the shock itself, decreases.

On the other hand, in the case of being composed of only the crystal grain (A) composed of the indium oxide phase, where tungsten does not make a solid solution, there is advantage of having superior sintering performance, as compared with a composition of only the crystal grain (B) composed of the indium oxide phase, where tungsten is present as a solid solution. In this case, density of the sintered body becomes a high value of over the above about 70%, however, on the contrary, strength of the sintered body can be enhanced.

In the present invention, in considering the above, the first oxide sintered body of the present invention intends to solve the problem by making a texture thereof to a combination of the crystal grain (A) composed of the indium oxide phase with a bixbyite type structure, where tungsten does not make a solid solution and the crystal grain (B) composed of the indium oxide phase with a bixbyite type structure, where tungsten is present as a solid solution. That is, it is intended that sintering density can be controlled to a low level of about 70% by utilization of inferior sintering performance of the crystal grain (B) composed of the indium oxide phase, where tungsten is present as a solid solution, and performance of the tablet for ion plating is enhanced by maintaining strength of the sintered body by utilization of superior sintering performance of the crystal grain (A) composed of the indium oxide phase, where tungsten does not make a solid solution.

In the crystal grain, the crystal grain (C) composed of the indium tungstate compound phase may be included, as a phase other than these. The indium tungstate compound phase includes, for example, the $In_6WO_{12}$ compound described in 49-336, the $InW_3O_9$ compound described in 33-627 of the JCPDS card, or a similar stoichiometric compound. Because the indium tungstate compound phase has inferior sintering performance, similarly as an indium oxide phase, where tungsten is present as a solid solution, sintering density can be controlled to a low level of about 70%. It should be noted that the indium tungstate compound phase may be enough only to maintain this crystal structure, even if composition is somewhat deviated from stoichiometric composition, or other ions is substituted at a part.

It is not preferable that the crystal grain (D) composed of the tungsten oxide phase is contained in the oxide sintered body of the present invention, however, small amount thereof does not give a trouble in stable film formation of a crystalline transparent conductive film. A small amount of the crystal grain (D) composed of the tungsten oxide phase means the one having an index of an area ratio of the crystal grain (D) composed of the tungsten oxide phase, that is, a crystal grain not having indium and having only tungsten and oxygen, relative to the whole crystal grain, is 5% or smaller, for example, when an image of SEM-EDS is analyzed. However, the case of containing the crystal grain (D) composed of the tungsten oxide phase causes a demerit of a certain decrease in film formation speed, although film characteristics itself is not so much different from the case of not containing the crystal grain (D) composed of the tungsten oxide phase, in film formation by an ion plating method.

(c) A Sintered Body Texture

The oxide sintered body of the present invention has a sintered body texture generating little crack, fracture or splash in film formation by an ion plating method.

In the case where the oxide sintered body containing indium and tungsten as oxides is processed, for example, as a tablet for ion plating, the crystal grain (A) composed of the indium oxide phase with a bixbyite type structure, where tungsten does not make a solid solution, and the crystal grain (B) composed of the indium oxide phase with a bixbyite type structure, where tungsten is present as a solid solution, exist at the surface or inside of said tablet. However, diameter of any of the crystal grains is not especially limited.

In FIGS. 1 (a) to 1 (d), exemplifying the oxide sintered body containing tungsten in 0.006 as an atomic ratio of W/(In+W), as one example, a secondary electron image using scanning electron microscope (SEM), and a surface analysis result by an energy dispersive X-ray analysis method (EDS), of the cross-section thereof are shown. FIG. 1 (a) is a secondary electron image of the oxide sintered body, and others are surface analysis results of (b) an indium element, (c) a tungsten element and (d) an oxygen element. Although it cannot be judged by the secondary electron image of FIG. 1 (a), from the surface analysis results of (b) the indium element and (c) the tungsten element, a crystal grain composed of indium and oxygen is shown in the photo, and it can be clearly discriminated from a crystal grain composed of indium, tungsten and oxygen, present at the center thereof.

As described above, in the oxide sintered body having such a texture as shown in FIG. 1, a crystal grain composed of indium and oxygen, that is, the crystal grain (A) composed of the indium oxide phase with a bixbyite type structure, where tungsten does not make a solid solution, is superior in sintering performance, therefore strength of the sintered body can be increased. At the same time, a crystal grain composed of indium, tungsten and oxygen, that is, the crystal grain (B) composed of the indium oxide phase with a bixbyite type structure, where tungsten is present as a solid solution, has inferior sintering performance, therefore it enables to decrease density of the sintered body, and consequently enables to secure impact resistance. In addition, diameter of the crystal grain shows 1 µm or larger in a result of FIG. 1, however, most of the cases, even when production conditions are changed, show 1 µm or larger.

In repeating the description above, it is clear that such a texture as described above is effective in suppressing crack, fracture or splash in film formation by an ion plating method. When the texture of the oxide sintered body is composed of two kinds, that is, the crystal grain (A) composed of the indium oxide phase with a bixbyite type structure, where tungsten does not make a solid solution superior in sintering performance, and the crystal grain (B) composed of the indium oxide phase with a bixbyite type structure, where tungsten is present as a solid solution inferior in sintering performance, compatibility of both securing strength and adjusting density of the sintered body (making lower density) becomes possible, and crack, fracture or splash can be suppressed. In this case, by combining these two kinds of the crystal grains, the density can be controlled within a range of 3.4 to 5.5 g/cm$^3$.

2) A Second Oxide Sintered Body

The second oxide sintered body of the present invention is an oxide sintered body further containing, in the first oxide sintered body, at least one or more kinds of a metal element (M element) selected from a metal element group consisting of titanium, zirconium, hafnium, and molybdenum, wherein a total content of tungsten and the M element is 0.001 to 0.15, as an atomic ratio of (W+M)/(In+W+M).

In the case where tungsten is added to the transparent conductive film having indium oxide as a main component, the effect generating the carrier electrons is lower as compared with, for example, tin of an additive element of ITO. However, mobility shown by carrier electrons generated is significantly higher as compared with tin. That is, the transparent conductive film made of indium oxide added with tungsten has low carrier electron concentration, however, by compensation of high carrier electron mobility, shows low specific resistance equivalent to that of ITO. Low carrier electron concentration means that high transmittance at an infrared region can be obtained, which is favorable to a device utilizing infrared rays such as a solar cell.

The element which enables low carrier electron concentration and high carrier electron mobility equivalent to the above includes titanium, zirconium, hafnium and molybdenum. When the second oxide sintered body is used, at least one or more kinds of metal element (M element) selected from these metal element groups are further contained to the transparent conductive film containing indium and tungsten. In this case, a total content of tungsten and the NI element is 0.001 to 0.15, as an atomic ratio of (W+M)/(In+W+M), preferably 0.002 to 0.10, and more preferably 0.003 to 0.05. In the case where the total content of tungsten and the M element is below 0.001 atomic %, carrier electrons required at the minimum, in the transparent conductive film formed using this as a raw material, cannot be generated, and is thus not preferable. On the other hand, in the case where atomic ratio is over 0.15, excess W and the M element behave as scattering centers of impurity ions, in the crystalline transparent conductive film formed, resulting in increase in specific resistance on the contrary, which makes use as a transparent electrode of a solar cell difficult.

It should be noted that, as described above, tin has far higher effect of carrier electron generation, when added to indium oxide, as compared with the above M element, therefore it should not be contained. Containment of also an element such as silicon, germanium, antimony, bismuth and tellurium is not preferable by the similar reason, although the above effect is a little inferior, as compared with tin. However, these elements may be included, as long as its content is 500 ppm or lower, as unavoidable impurities.

It is preferable that the second oxide sintered body of the present invention has a generation phase or a texture thereof similar to that of the first oxide sintered body. It should be noted that any of at least one or more kinds of the metal element (the M element) selected from the metal element group consisting of titanium, zirconium, hafnium and molybdenum makes a solid solution into an indium oxide phase, with priority. The M element gives little influence on sintering performance of the oxide sintered body, irrespective of whether tungsten makes a solid solution into the indium oxide phase or not. For example, there is no change in superiority of sintering performance, even when the element makes a solid solution into the crystal grain (A) composed of the indium oxide phase with a bixbyite type structure, where tungsten does not make a solid solution. Similarly, there is no change in inferiority of sintering performance, even when the M element makes a solid solution into the crystal grain (B) composed of the indium oxide phase with a bixbyite type structure, where tungsten is present as a solid solution. Accordingly, the M element may make a solid solution into the crystal grain (A) composed of the indium oxide phase with a bixbyite type structure, where tungsten does not make a solid solution, or may make a solid solution into the crystal grain (B) composed of the indium oxide phase with a bixbyite type structure, where tungsten is present as a solid solution along with tungsten, or may make a solid solution into both.

That is, the second oxide sintered body is mainly composed of at least the crystal grain (A) composed of the indium oxide phase with a bixbyite type structure, where tungsten does not make a solid solution and at least the crystal grain (B) composed of the indium oxide phase with a bixbyite type structure, where tungsten is present as a solid solution, where total content of tungsten and the NT element is 0.001 to 0.15, as an atomic ratio of (W+M)/(In+W+, in the oxide sintered body containing indium and tungsten, as well as at least one or more kinds of metal element (M element) selected from the metal element group consisting of titanium, zirconium, hafnium and molybdenum, as an oxide.

In the crystal grain, there may be contained the crystal grain (C) including the indium tungstate compound phase, as a phase other than these. In addition, it is not preferable that the crystal grain (D) composed of the tungsten oxide phase is included in the oxide sintered body of the present invention, however, there is no trouble in stable film formation of the crystalline transparent conductive film as long as it is small amount. The crystal grain (C) composed of the indium tungstate compound phase and the crystal grain (D) composed of the tungsten oxide phase are as described above.

In this way, by composing the texture of the oxide sintered body mainly by at least two kinds: the crystal grain (A)

composed of the indium oxide phase with a bixbyite type structure, where tungsten does not make a solid solution having superior sintering performance and the crystal grain (B) composed of the indium oxide phase with a bixbyite type structure, where tungsten is present as a solid solution, having inferior sintering performance, compatibility of both securing strength and adjusting density of the sintered body (making lower density) becomes possible, and crack, fracture or splash can be suppressed. In this case, by combining these two kinds of the crystal grains, density is controlled in a range of 3.4 to 5.5 g/cm$^3$.

As a raw material of the oxide sintered body of the present invention, indium oxide powder and tungsten oxide powder, or further oxide powder of at least one or more kinds of a metal element (M element) selected from the metal element group consisting of titanium, zirconium, hafnium, and molybdenum are used. Such powder is subjected to, as appropriate, mixing, calcination, granulation and compacting to obtain a compact, which is sintered by a normal pressure sintering method. Alternately, the above powder is granulated and then compacted by a hot press method and sintered. The normal pressure sintering method is a simple and convenient, as well as an industrially advantageous method, and a preferable means, however, the hot press method may be used as needed.

1) The Normal Pressure Sintering Method

In the present invention, in the case of using the normal pressure sintering method to obtain the oxide sintered body, a compact is prepared firstly.

For example, in the case of the first oxide sintered body, indium oxide powder and tungsten oxide powder are each weighed as raw material powder, so that a desired composition is obtained. The raw material powder has preferably an average particle diameter of 3 µm or smaller, and more preferably 1.5 µm or smaller. In particular, indium oxide, by controlling the average particle diameter in this way, enables to secure sufficient sintering performance. As a result, by the crystal grain (A) composed of the indium oxide phase with a bixbyite type structure, where tungsten does not make a solid solution, required and sufficient strength of the oxide sintered body suitable for the tablet for ion plating is secured.

20 to 95% by weight of indium oxide powder, among indium oxide powder weighed, and the whole amount of tungsten oxide weighed are charged in a resin pot, and subjected to the primary mixing together with a dispersing agent or a binder (for example, PVA is used) or the like, using a wet-type ball mill or a beads mill or the like. Mixing time is preferably set at 18 hours or longer. As a ball for mixing, a hard-type $ZrO_2$ ball may be used. After the mixing, slurry is taken out for performing filtration and drying to obtain mixed powder. It should be noted that amount of the indium oxide powder to be mixed with the tungsten oxide powder is more preferably 20 to 80% by weight, and still more preferably 20 to 75% by weight.

The resultant primary mixed powder forms the crystal grain (B) composed of the indium oxide phase with a bixbyite type structure, where tungsten is present as a solid solution, by calcination. Calcination is performed by heat treatment at a temperature of from 800° C. to 1500° C. for 10 hours or longer under the air, oxygen atmosphere or in vacuum, using a gas flow-type heating furnace, or a vacuum heating furnace. For example, in the case of the first oxide sintered body, by calcination, it is promoted that tungsten makes a solid solution into indium oxide, or an indium tungstate compound is generated, before sintering. It should be noted that calcination condition is preferably set at a temperature of from 900° C. to 1400° C., for 12 hours or longer.

On the other hand, the residual indium oxide powder (5 to 80% by weight) among the indium oxide powder weighed forms the crystal grain (A) composed of the indium oxide phase with a bixbyite type structure, where tungsten does not make a solid solution, after passed through the step of sintering or the like afterwards. This indium oxide powder may be calcinated, as needed, under similar condition as in the primary mixed powder. Calcination of the residual indium oxide powder can suppress for tungsten to make a solid solution into indium oxide in sintering afterwards. However, tungsten, different from the metal element group consisting of titanium, zirconium, hafnium and molybdenum, is difficult to diffuse into indium oxide. Accordingly, even the residual indium oxide powder is not yet calcinated, in sintering afterwards, it is difficult for tungsten to make a solid solution from the primary mixed powder calcinated, or generation of the indium tungstate compound is difficult. On the other hand, because the other metal element group such as titanium is easy to diffuse into indium oxide, it easily makes a solid solution into the residual indium oxide powder in sintering afterwards, in the case of a non-calcinated state.

That is, in the case of the second oxide sintered body, oxide powder of the metal element group consisting of titanium, zirconium, hafnium and molybdenum, to be added together, may be added into any of the mixed powder, the residual indium oxide powder or both, at the stage before calcination.

After passed through the above steps, the mixed powder and the residual indium oxide powder are subjected to the secondary mixing, by a method similar to the above. The resultant secondary mixed powder is granulated after subjecting to filtering and drying. After that, the resultant granulated powder is converted to a compact, by compacting under a pressure of about 4.9 MPa (50 kg/cm$^2$) to 196 MPa (2000 kg/cm$^2$), using a single screw press or a cold isostatic press.

It is preferable that the above raw material powder has an average particle diameter of 3 µm or smaller, and more preferably 1.5 µm or smaller. In particular, indium oxide becomes possible to secure sufficient sintering performance by controlling the average particle diameter in this way. As a result, by the crystal grain (A) composed of the indium oxide phase with a bixbyite type structure, where tungsten does not make a solid solution, required and sufficient strength of the oxide sintered body suitable for the tablet for ion plating, is secured.

In a sintering step of the normal pressure sintering method, heating of a compact is performed at a predetermined temperature range under atmosphere where oxygen exists. To obtain a tablet for ion plating, the compact is sintered preferably at 1000 to 1500° C. for 10 to 30 hours, under atmosphere where oxygen exists. It is more preferable to sinter at 1100 to 1400° C., under atmosphere where oxygen gas is introduced into air inside a sintering furnace. Sintering time is preferably from 15 to 25 hours.

The too low sintering temperature does not progress a sintering reaction sufficiently. In particular, to obtain the oxide sintered body with a relatively high density of 3.4 g/cm$^3$ or higher, the temperature is preferably 1000° C. or higher. On the other hand, the sintering temperature over 1500° C. may make density of the oxide sintered body over 5.5 g/cm$^3$, in some cases.

Sintering atmosphere is preferably atmosphere in the presence of oxygen, and still more preferably atmosphere where oxygen gas is introduced into air inside the sintering furnace. Presence of oxygen in sintering enables to make higher density of the oxide sintered body. When temperature rises up to sintering temperature, to prevent crack of the sintered body and progress de-binder, it is preferable to set temperature rising rate in a range of from 0.2 to 5° C./min. In addition, as needed, different temperature rising rates may be combined to raise temperature up to sintering temperature. In the temperature rising step, specific temperature may be held for a certain period aiming at progressing of de-binder or sintering. In cooling after sintering, introduction of oxygen is stopped, and temperature is reduced down to 1000° C. in a range of from 0.2 to 10° C./min. It is preferable to set the temperature falling rate in a range of from 0.2 to 5° C./min, in particular, 0.2° C./min to 1° C./min.

2) The Hot Press Method

In the present invention, in the case where the hot press method is adopted in producing the oxide sintered body, the secondary mixed powder obtained similarly as in the normal pressure sintering method, is compacted and sintered at 700 to 950° C. for 1 to 10 hours under a pressure of 2.45 to 29.40 MPa under inert gas atmosphere or in vacuum. The hot press method is capable of decreasing oxygen content in the sintered body, because raw material powder of the oxide sintered body is subjected to compacting and sintering under reducing atmosphere, as compared with the above normal pressure sintering method. However, caution is required in compacting and sintering at a high temperature over 950° C., because of reduction of indium oxide and melting as metal indium.

Next, one example of production condition in the case of obtaining the oxide sintered body of the present invention by the hot press method is given. Raw material powder preferably has an average particle diameter of 3 μm or smaller, and more preferably 1.5 μm or smaller, by similar reason as in the normal pressure sintering method.

The secondary mixed powder is obtained similarly as in the normal pressure sintering method, and granulated powder is obtain. Next, the granulated mixed powder is supplied into a carbon container to sinter it by the hot press method. Sintering condition is not especially limited, and sintering temperature may be set at from 700 to 950° C., pressure may be set at from 4.9 MPa to 29.4 MPa (50 to 300 kgf/cm$^2$), and sintering time may beset from 1 to 10 hours, more preferably, sintering temperature may be set at from 700 to 900° C., pressure may be set at from 4.9 MPa to 24.5 MPa (50 to 250 kgf/cm$^2$), and sintering time may be set from 1 to 5 hours. Atmosphere during hot press is preferably under inert gas such as Ar, or in vacuum.

3. The Tablet for Ion Plating

The tablet for ion plating is obtained by cutting the oxide sintered body of the present invention to a predetermined size, and polishing processing of the surface.

It is required that the tablet for the ion plating is controlled to have a density of 3.4 to 5.5 g/cm$^3$. The density below 3.4 g/cm$^3$ provides inferior strength of the sintered body itself, and thus crack or fracture easily generates even for small and local thermal expansion. The density over 5.5 g/cm$^3$ makes impossible to absorb stress or strain generated locally in charging plasma beams or electron beams, and crack generates easily, making difficult high speed film formation. Preferable density is 3.8 to 5.3 g/cm$^3$, and more preferable density is 4.0 to 5.0 g/cm$^3$. In the present invention, by density adjustment (to make lower density) of the oxide sintered body, an opening (void) part becomes present in a tablet texture.

Diameter and thickness are not especially limited, however, it is required to have shape matching to an ion plating apparatus to be used. In general, circular cylinder shape is used often, and for example, the one having a diameter of 20 to 50 mm, and a height of about 30 to 100 mm is preferable.

It should be noted that this tablet for the ion plating may be used as a tablet for vacuum vapor deposition.

4. The Transparent Conductive Film and a Film Formation Method Thereof.

In the present invention, the mainly crystalline transparent conductive film is formed on a substrate, using the tablet for ion plating processed with the above oxide sintered body.

As the substrate, various plates or films may be used, such as glass, synthetic quartz, a synthetic resin such as PET or polyimide, a stainless steel plate, in response to applications. In particular, because heating is required in forming the crystalline transparent conductive film, the substrate having heat resistance is necessary.

In the ion plating method, increase in direct-current power to be charged has been performed generally to enhance film formation speed of the transparent conductive film. The first and the second oxide sintered bodies of the present invention are composed by the crystal grain (A) composed of the indium oxide phase with a bixbyite type structure, where tungsten does not make a solid solution and is superior in sintering performance, and the crystal grain (B) composed of the indium oxide phase with a bixbyite type structure, where tungsten is present as a solid solution and is inferior in sintering performance, or are composed by containing the crystal grain (C) composed of the indium tungstate compound phase, which is inferior in sintering performance. Therefore, both strength and low density of the oxide sintered body are satisfied, and thus even when direct-current power to be charged is increased, crack, fracture or splash can be suppressed.

1) Film Formation by the Ion Plating Method

In the ion plating method, using the tablet for ion plating (it may also be called the pellet), the transparent conductive film is formed. As the tablet for ion plating, the one obtained by processing the oxide sintered body with a density of 3.4 to 5.5 g/cm$^3$ of the present invention is used.

As described above, in the ion plating method, irradiation of heat or the like by electron beams or arc discharge onto the tablet, which become an evaporation source, raises temperature locally at a part irradiated, by which evaporation particles are evaporated and deposited onto a substrate. In this time, evaporated particles are ionized by electron beams or arc discharge. There are various methods for ionization, however, a high density plasma assisted vacuum deposition method (HDPE method) using a plasma generation apparatus (a plasma gun) is suitable for formation of a transparent conductive film with good quality. In this method, arc discharge using the plasma gun is utilized. Arc discharge is maintained between a built-in cathode in said plasma gun and a crucible (anode) of an evaporation source. By introducing electrons emitted from the cathode into the crucible by magnetic field deflection, irradiation is concentrated locally onto the tablet charged in the crucible. By this electron beams, particles are evaporated from a locally high temperature part, and deposited onto the substrate. Because evaporation particles thus vaporized or $O_2$ gas introduced as reaction gas is ionized and activated in this plasma, a transparent conductive film with good quality can be prepared.

To form the transparent conductive film, it is preferable to use mixed gas composed of inert gas and oxygen, in particular, argon and oxygen. In addition, it is preferable that inside the chamber of an apparatus is set at a pressure of 0.1 to 3 Pa, and more preferably, 0.2 to 2 Pa.

In the present invention, film formation is possible at room temperature without heating the substrate, however, the substrate may also be heated at 50 to 500° C., preferably, 150 to 400° C. For example, in applying to a transparent electrode for a solar cell, a crystalline transparent conductive film can be formed with maintaining the substrate temperature at from 150 to 400° C.

2) The Transparent Conductive Film Obtained

In this way, by using the tablet for ion plating of the present invention, an amorphous or crystalline transparent conductive film superior in optical characteristics and electric conductivity can be produced on a substrate in relatively high film formation speed by an ion plating method.

Composition of the resultant transparent conductive film becomes nearly equal to that of the tablet for ion plating. Film thickness is different depending on applications, however, 10 to 1000 nm can be attained. It should be noted that the amorphous transparent conductive film can be converted to a crystalline one by heating it at 300 to 500° C. for 10 to 60 minutes under inert gas atmosphere.

Specific resistance of the crystalline transparent conductive film was calculated from a product of surface resistance measured by a four-probe method using a resistivity meter, and film thickness, and is preferably $5.0 \times 10^{-4}$ Ω·cm or lower, and more preferably $3.0 \times 10^{4}$ Ω·cm or lower. It should be noted that even it is amorphous, there is the case that the specific resistance shows $5.0 \times 10^{-4}$ Ω·cm or lower, depending on film composition. A generated phase of this film is identified by an X-ray diffraction method, and fundamentally is only an indium oxide phase. In addition, as for transmittance, an average transmittance in a visible range showed at least 80% or higher, and in most cases, it shows 85% or higher. In applications for a surface electrode etc. of a solar cell, transmittance in an infrared range is also required, and the transparent conductive film formed by using the tablet for the ion plating of the present invention is good and, for example, shows transmittance, at a wavelength of 1000 nm, of at least 80% or higher, and suitably 85% or higher.

It should be noted that the crystalline or amorphous transparent conductive film formed by using the tablet for ion plating of the present invention is be formed similarly using a vapor deposition method as well.

EXAMPLES

Explanation will be given below specifically on the present invention with reference to Examples and Comparative Examples, however, the present invention should not be limited thereto.

(Evaluation of the Oxide Sintered Body)

Using the mill ends, density of the oxide sintered substance obtained was determined by the Archimedes' method, subsequently a part of the mill ends was crushed to perform identification of generated phases of the oxide sintered substance by a powder method, with an X-ray diffraction apparatus (X'pert PRO MPD, manufactured by Philips Co., Ltd.). In addition, using a part of the powder, composition analysis of the oxide sintered body was performed by an ICP emission spectroscopy. Still more, with a scanning electron microscope, and an energy dispersive X-ray analysis method (SEM-EDS, ULTRA55, manufactured by Carl Zeiss Japan Co., Ltd., and QuanTax QX400, manufactured by Bulker Japan Cp., Ltd.), texture observation of the oxide sintered body, along with surface analysis were performed. To perform observation of each crystal grain, determination of a structure and composition analysis, a transmission electron microscope and the energy dispersive X-ray analysis method (TEM-EDS, HF-2200, manufactured by Hitachi High-Technology, Corp., and NORAN VANTAGE) were used.

(Evaluation of Fundamental Characteristics of the Transparent Conductive Film)

Composition of the resultant transparent electric conductive film was studied by an ICP emission spectroscopy. Film thickness of the transparent conductive film was measured with a surface roughness tester (Alpha-Step IQ, manufactured by Tencor Japan Corp.). Film formation speed was calculated from film thickness and film formation time. Specific resistance of the film was calculated from a product of surface resistance measured by a four-probe method using a resistivity meter (Rolester EP MCP-T360 model, manufactured by Mitsubishi Chemical Analytech Co., Ltd.), and film thickness. Transmittance of the film was measured using a spectrometer (V-570, manufactured by JASCO Corp.). A generated phase of the film was identified by X-ray diffraction measurement, similarly as in the oxide sintered body.

Example 1

Indium oxide powder and tungsten oxide powder having an average particle diameter of 1.5 µm or smaller were used as raw material powder. Each powder was weighed, so that tungsten content is 0.006, as atom number ratio represented by W/(In +W). 50% by weight of the indium oxides powder and the whole amount of the tungsten oxide powder, among them, were charged into a pot made of a resin, together with water and a dispersing agent or the like to be mixed in a wet-type ball mill. In this case, hard-type $ZrO_2$ ball was used, and mixing time was set to 18 hours. After the mixing, slurry was taken out, filtered, and dried to obtain primary mixed powder. Subsequently, temperature of the primary mixed powder was raised in a temperature rising rate of 1° C./min in a sintering furnace, and calcination was performed under condition of 1250° C. for 10 hours. Residual indium oxide powder was not calcinated.

Then, these calcinated powder and the non-calcinated powder were mixed again using wet-type ball mill. After the mixing, slurry was filtered, and dried to obtain secondary mixed powder. Subsequently, this secondary mixed powder was granulated. Next, the granulated powder was filled into a forming die to form a tablet shape, by applying a pressure of 9.8 MPa using a single screw press machine. The tablet was formed in advance so as to attain dimension after sintering of a diameter of 30 mm, and a height of 40 mm.

Next, the compact was sintered as follows. Under atmosphere where oxygen was introduced into air inside the furnace, in a ratio of 5 litter/minute per 0.1 m³ of inner volume of the furnace, sintering was performed at a sintering temperature of 1250° C. for 20 hours. In this case, temperature was raised in a temperature rising rate of 1° C./min, and was lowered in a temperature falling rate of 10° C./min down to 1000° C., while stopping oxygen introduction at cooling after sintering.

Composition analysis of the resultant oxide sintered body was performed by an ICP emission spectrometry, and it was confirmed to be nearly the same as charging composition in weighing of raw material powder. Density of the oxide sintered body was measured and found to be 4.84 g/cm.

Figure 2:
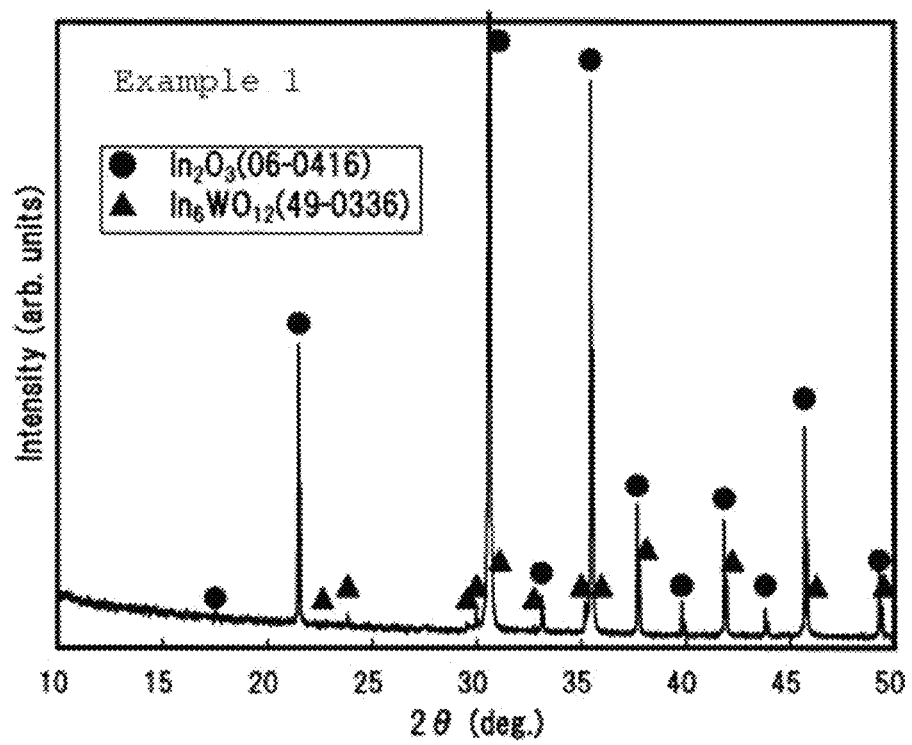
FIG. 2 is a chart showing phase identification result using X-ray diffraction, of an oxide sintered body of the present invention having an atomic ratio of W/(In+W) of 0.006.

Next, phase identification of the oxide sintered body was performed by X-ray diffraction measurement. As a result, it was confirmed, as shown in FIG. 2, that the oxide sintered body is composed of the $In_2O_z$ phase (●) with a bixbyite type structure, and the $In_6WO_{12}$ phase (▲) of the indium tungstate compound.

Subsequently, texture observation of the oxide sintered body and composition analysis of the crystal grain were performed using SEM-EDS. It has been clear that, as a result of surface analysis of element distribution using EDS, as shown in FIG. 1, there are the crystal grain where tungsten exists (at the center part of the photo), and the crystal grain where tungsten does not exist (at the peripheral part of the photo). That is, it has become clear that there exist the crystal grain composed of the indium oxide phase, where tungsten does not make a solid solution, the crystal grain composed of the indium oxide phase, where tungsten is present as a solid solution, and the crystal grain composed of the $In_6WO_{12}$ phase of the indium tungstate compound. It should be noted that any of the crystal grains has a particle diameter of over about 1 µm.

Still more, texture observation of each crystal grain in the oxide sintered body by TEM-EDS, electron-beam diffraction measurement and composition analysis were performed. As a result of the electron-beam diffraction measurement, it was confirmed the crystal grain composed of the indium oxide phase and the crystal grain composed of the $In_6WO_{12}$ phase of the indium tungstate compound. Next, as a result of point analysis using EDS, it was confirmed that there exist both the crystal grain not containing tungsten and the crystal grain containing tungsten in the crystal grain composed of the indium oxide phase.

From a result of the above analysis, it was confirmed that in the oxide sintered body of the present Example, there exist the crystal grain (A) composed of the indium oxide phase with a bixbyite type structure, where tungsten does not make a solid solution, the crystal grain (B) composed of the indium oxide phase with a bixbyite type structure, where tungsten is present as a solid solution, and the crystal grain (C) composed of the $In_6WO_{12}$ phase of the indium tungstate compound.

After that, this oxide sintered body was processed to the tablet, and discharge using a plasma gun by an ion plating method was continued, until the tablet became not usable. As an ion plating apparatus, a reactive plasma vapor deposition apparatus was used, where high density plasma assisted vacuum deposition method (HDPE method) is applicable. In a film formation chamber, an arc plasma generation apparatus of low voltage (about 70 V) and large current (250 A), and a crucible for charging a raw material (tablet) are installed. Thermoelectrons emitted from the cathode surface of the plasma generation apparatus are discharged into the chamber with guiding by a magnetic field, and irradiated in a concentrated way onto the tablet inside the crucible. Arc discharge is maintained between the cathode and the anode (crucible) by Ar gas introduced from just near the cathode. Mixed gas of Ar and $O_2$ is introduced inside the chamber and vacuum degree was $4 \times 10^{-2}$ Pa. To investigate discharge stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate, a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be $2.5 \times 10^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten is in a solid solution state in the indium oxide phase.

Example 2

An oxide sintered body along with a tablet for ion plating were prepared by a similar method as in Example 1, except that raw material powder was weighed, so that tungsten content became 0.018, as atom number ratio represented by W/(In+W).

Composition analysis of the resultant oxide sintered body was performed by an ICP emission spectrometry, and it was confirmed to be nearly the same as charging composition in weighing of raw material powder. Density of the oxide sintered body was measured and found to be 4.96 g/cm³.

Next, phase identification of the oxide sintered body was performed by X-ray diffraction measurement. It was confirmed that the oxide sintered body is composed of the $In_2O_3$ phase with a bixbyite type structure, and the $In_6WO_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. That is, it has become clear that there exist the crystal grain composed of the indium oxide phase, where tungsten does not make a solid solution, the crystal grain composed of the indium oxide phase, where tungsten is present as a solid solution, and the crystal grain composed of the $In_6WO_{12}$ phase of the indium tungstate compound. It should be noted that any of the crystal grains has a particle diameter of over about 1 µm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase and the crystal grain composed of the $In_6WO_{12}$ phase of the indium tungstate compound exist. Next, as a result of point analysis using EDS, it was confirmed that, in the crystal grain composed of the indium oxide phase, there exist both the crystal grain not containing tungsten and the crystal grain containing tungsten.

From a result of the above analysis, it was confirmed that in the oxide sintered body of the present Example, there exist the crystal grain (A) composed of the indium oxide phase with a bixbyite type structure, where tungsten does not make a solid solution, the crystal grain (B) composed of the indium oxide phase with a bixbyite type structure, where tungsten is present as a solid solution, and the crystal grain (C) composed of the $In_6WO_{12}$ phase of the indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable and discharge was performed similarly. To investigate film formation stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be $2.4 \times 10^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten is in a solid solution state in the indium oxide phase.

Example 3

An oxide sintered body along with a tablet for ion plating were prepared by a similar method as in Example 1, except that raw material powder was weighed, so that tungsten content became 0.001, as atom number ratio represented by W/(In+W).

Composition analysis of the resultant oxide sintered body was performed by an ICP emission spectrometry, and it was confirmed to be nearly the same as charging composition in weighing of raw material powder. Density of the oxide sintered body was measured and found to be 4.78 g/cm$^3$.

Next, phase identification of the oxide sintered body was performed by X-ray diffraction measurement. It was confirmed that the oxide sintered body is composed of only the $In_2O_3$ phase with a bixbyite type structure. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. That is, it has become clear that there exist the crystal grain composed of the indium oxide phase, where tungsten does not make a solid solution, and the crystal grain composed of the indium oxide phase, where tungsten is present as a solid solution. It should be noted that any of the crystal grains has a particle diameter of over about 1 µm.

Still more, texture observation of each crystal grain in the oxide sintered body using TEM-EDS, electron-beam diffraction measurement and composition analysis were performed. As a result of the electron-beam diffraction measurement, it has confirmed the crystal grain composed of the indium oxide phase. Next, as a result of point analysis using EDS, it was confirmed that, in the crystal grain composed of the indium oxide phase, there exist both the crystal grain not containing tungsten and the crystal grain containing tungsten.

From a result of the above analysis, it was confirmed that in the oxide sintered body of the present Example, there exist the crystal grain (A) composed of the indium oxide phase with a bixbyite type structure, where tungsten does not make a solid solution, and the crystal grain (B) composed of the indium oxide phase with a bixbyite type structure, where tungsten is present as a solid solution, and the crystal grain (C) composed of the $In_6WO_{12}$ phase of the indium tungstate compound does not exist.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable and discharge was performed similarly. To investigate film formation stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be $3.5 \times 10^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten is in a solid solution state in the indium oxide phase.

Example 4

An oxide sintered body along with a tablet for ion plating were prepared by a similar method as in Example 1, except that raw material powder was weighed, so that tungsten content became 0.003, as atom number ratio represented by W/(In+W).

Composition analysis of the resultant oxide sintered body was performed by an ICP emission spectrometry, and it was confirmed to be nearly the same as charging composition in weighing of raw material powder. Density of the oxide sintered body was measured and found to be 4.82 g/cm$^3$.

Next, phase identification of the oxide sintered body was performed by X-ray diffraction measurement. It was confirmed that the oxide sintered body is composed of only the $In_2O_3$ phase with a bixbyite type structure. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. That is, it has become clear that there exist the crystal grain composed of the indium oxide phase, where tungsten does not make a solid solution, and the crystal grain composed of the indium oxide phase, where tungsten is present as a solid solution. It should be noted that any of the crystal grains has a particle diameter of over about 1 µm.

Still more, texture observation of each crystal grain in the oxide sintered body using TEM-EDS, electron-beam diffraction measurement and composition analysis were performed. As a result of the electron-beam diffraction measurement, it was confirmed the crystal grain composed of the indium oxide phase. Next, as a result of point analysis using EDS, it was confirmed that, in the crystal grain composed of the indium oxide phase, there exist both the crystal grain not containing tungsten and the crystal grain containing tungsten.

From a result of the above analysis, it was confirmed that in the oxide sintered body of the present Example, there exist the crystal grain (A) composed of the indium oxide phase with a bixbyite type structure, where tungsten does not make a solid solution, and the crystal grain (B) composed of the indium oxide phase with a bixbyite type structure, where tungsten is present as a solid solution, and the crystal grain (C) composed of the $In_6WO_{12}$ phase of the indium tungstate compound does not exist.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable and discharge was performed similarly. To investigate film formation stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be $2.9 \times 10^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten is in a solid solution state in the indium oxide phase.

Example 5

An oxide sintered body along with a tablet for ion plating were prepared by a similar method as in Example 1, except that raw material powder was weighed, so that tungsten content became 0.05, as atom number ratio represented by W/(In+W).

Composition analysis of the resultant oxide sintered body was performed by an ICP emission spectrometry, and it was confirmed to be nearly the same as charging composition in weighing of raw material powder. Density of the oxide sintered body was measured and found to be 4.99 g/cm³.

Next, phase identification of the oxide sintered body was performed by X-ray diffraction measurement. It was confirmed that the oxide sintered body is composed of the $In_2O_3$ phase with a bixbyite type structure, and the $In_6WO_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. That is, it has become clear that there exist the crystal grain composed of the indium oxide phase, where tungsten does not make a solid solution, the crystal grain composed of the indium oxide phase, where tungsten is present as a solid solution, and the crystal grain composed of the $In_6WO_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it has confirmed the crystal grain composed of the indium oxide phase, and the crystal grain composed of the $In_6WO_{12}$ phase of the indium tungstate compound. Next, as a result of point analysis using EDS, it was confirmed that, in the crystal grain composed of the indium oxide phase, there exist both the crystal grain not containing tungsten and the crystal grain containing tungsten.

From a result of the above analysis, it was confirmed that in the oxide sintered body of the present Example, there exist the crystal grain (A) composed of the indium oxide phase with a bixbyite type structure, where tungsten does not make a solid solution, the crystal grain (B) composed of the indium oxide phase with a bixbyite type structure, where tungsten is present as a solid solution, and the crystal grain (C) composed of the $In_6WO_{12}$ phase of the indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable and discharge was performed similarly. To investigate film formation stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be $3.0 \times 10^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten is in a solid solution state in the indium oxide phase.

Example 6

An oxide sintered body along with a tablet for ion plating were prepared by a similar method as in Example 1, except that raw material powder was weighed, so that tungsten content became 0.10, as atom number ratio represented by W/(In+W).

Composition analysis of the resultant oxide sintered body was performed by an ICP emission spectrometry, and it was confirmed to be nearly the same as charging composition in weighing of raw material powder. Density of the oxide sintered body was measured and found to be 4.96 g/cm³.

Next, phase identification of the oxide sintered body was performed by X-ray diffraction measurement. It was confirmed that the oxide sintered body is composed of the $In_2O_3$ phase with a bixbyite type structure, and the $In_6WO_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. That is, it has become clear that there exist the crystal grain composed of the indium oxide phase, where tungsten does not make a solid solution, the crystal grain composed of the indium oxide phase, where tungsten is present as a solid solution, and the crystal grain composed of the $In_6WO_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it has confirmed the crystal grain composed of the indium oxide phase, and the crystal grain composed of the $In_6WO_{12}$ phase of the indium tungstate compound. Next, as a result of point analysis using EDS, it was confirmed that, in the crystal grain composed of the indium oxide phase, there exist both the crystal grain not containing tungsten and the crystal grain containing tungsten.

From a result of the above analysis, it was confirmed that in the oxide sintered body of the present Example, there exist the crystal grain (A) composed of the indium oxide phase with a bixbyite type structure, where tungsten does not make a solid solution, the crystal grain (B) composed of the indium oxide phase with a bixbyite type structure, where tungsten is present as a solid solution, and the crystal grain (C) composed of the $In_6WO_{12}$ phase of the indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable and discharge was performed similarly. To investigate film formation stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be $4.0 \times 10^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten is in a solid solution state in the indium oxide phase.

Example 7

An oxide sintered body along with a tablet for ion plating were prepared by a similar method as in Example 1, except that raw material powder was weighed, so that tungsten content became 0.15, as atom number ratio represented by W/(In+W).

Composition analysis of the resultant oxide sintered body was performed by an ICP emission spectrometry, and it was confirmed to be nearly the same as charging composition in weighing of raw material powder. Density of the oxide sintered body was measured and found to be 4.91 g/cm³.

Next, phase identification of the oxide sintered body was performed by X-ray diffraction measurement. It was confirmed that the oxide sintered body is composed of the $In_2O_3$ phase with a bixbyite type structure, and the $In_6WO_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. That is, it has become clear that there exist the crystal grain composed of the indium oxide phase, where tungsten does not make a solid solution, the crystal grain composed of the indium oxide phase, where tungsten is present as a solid solution, and the crystal grain composed of the $In_6WO_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it has confirmed the crystal grain composed of the indium oxide phase, and the crystal grain composed of the $In_6WO_{12}$ phase of the indium tungstate compound. Next, as a result of point analysis using EDS, it was confirmed that, in the crystal grain composed of the indium oxide phase, there exist both the crystal grain not containing tungsten and the crystal grain containing tungsten.

From a result of the above analysis, it was confirmed that in the oxide sintered body of the present Example, there exist the crystal grain (A) composed of the indium oxide phase with a bixbyite type structure, where tungsten does not make a solid solution, the crystal grain (B) composed of the indium oxide phase with a bixbyite type structure, where tungsten is present as a solid solution, and the crystal grain (C) composed of the $In_6WO_{12}$ phase of the indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable and discharge was performed similarly. To investigate film formation stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be $4.8 \times 10^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten is in a solid solution state in the indium oxide phase.

Example 8

Indium oxide powder and tungsten oxide powder having an average particle diameter of 1.5 μm or smaller were used as raw material powder. The powder were weighed, so that tungsten content is 0.006, as atom number ratio represented by W/(In +W). 75% by weight of the indium oxides powder and the whole amount of the tungsten oxide powder, among them, were charged in a pot made of a resin, together with water and a dispersing agent or the like to be mixed in a wet-type ball mill. In this case, hard-type $ZrO_2$ balls were used, and mixing time was set to 18 hours. After the mixing, slurry was taken out, filtered, and dried to obtain primary mixed powder. Subsequently, temperature of the primary mixed powder was raised in a temperature rising rate of 1° C./min in a sintering furnace, and calcination was performed under condition of 1250° C. for 10 hours. Residual indium oxide powder was calcinated under condition of 1000° C. for 10 hours. Then, these two kinds of the calcinated powder were mixed again using the wet-type ball mill. After the mixing, slurry was filtered, and dried to obtain secondary mixed powder. Subsequently, this secondary mixed powder was granulated. Next, the granulated powder was filled into a forming die to form a tablet shape, by applying a pressure of 6.0 MPa, using a single screw press machine. The tablet was formed in advance so as to attain dimension after sintering of a diameter of 30 mm, and a height of 40 mm.

Next, the compact was sintered as follows. Under atmosphere where oxygen was introduced into air inside the furnace, in a ratio of 5 litter/minute, per 0.1 m³ of inner volume of the furnace, sintering was performed at a sintering temperature of 1250° C. for 20 hours. In this case, temperature was raised in a temperature rising rate of 1° C./min, and was lowered in a temperature falling rate of 10° C./min down to 1000° C., while stopping oxygen introduction at cooling after sintering.

Composition analysis of the resultant oxide sintered body was performed by an ICP emission spectrometry, and it was confirmed to be nearly the same as charging composition in weighing of raw material powder. Density of the oxide sintered body was measured and found to be 4.80 g/cm³.

Next, phase identification of the oxide sintered body was performed by X-ray diffraction measurement. It was confirmed that the oxide sintered body is composed of the $In_2O_3$ phase with a bixbyite type structure, and the $In_6WO_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. That is, it has become clear that there exist the crystal grain composed of the indium oxide phase, where tungsten does not make a solid solution, the crystal grain composed of the indium oxide phase, where tungsten is present as a solid solution, and the crystal grain composed of the $In_6WO_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase and the crystal grain composed of the $In_6WO_{12}$ phase of the indium tungstate compound exist. Next, as a result of point analysis using EDS, it was confirmed that, in the crystal grain composed of the indium oxide phase, there exist both the crystal grain not containing tungsten and the crystal grain containing tungsten.

From a result of the above analysis, it was confirmed that in the oxide sintered body of the present Example, there exist the crystal grain (A) composed of the indium oxide phase with a bixbyite type structure, where tungsten does not make a solid solution, the crystal grain (B) composed of the indium oxide phase with a bixbyite type structure, where tungsten is present as a solid solution, and the crystal grain (C) composed of the $In_6WO_{12}$ phase of the indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable, for similar discharging. To investigate film formation stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be $2.6 \times 10^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten is in a solid solution state in the indium oxide phase.

Example 9

Indium oxide powder, tungsten oxide powder and titanium oxide powder having an average particle diameter of 1.5 μm or smaller were used as raw material powder. The powder were weighed, so that tungsten content is 0.006, as atom number ratio represented by W/(In+W+Ti), and titanium content is 0.006, as atom number ratio represented by Ti/(In+W+Ti). 50% by weight of the indium oxides powder and the whole amount of the tungsten oxide powder and the titanium oxide powder, among them, were charged in a pot made of a resin, together with water and a dispersing agent or the like to be mixed in a wet-type ball mill. In this case, hard-type $ZrO_2$ balls were used, and mixing time was set to 18 hours. After the mixing, slurry was taken out, filtered, and dried to obtain primary mixed powder. Subsequently, temperature of the primary mixed powder was raised in a temperature rising rate of 1° C./min in a sintering furnace, and calcination was performed under condition of 1250° C. for 10 hours. Residual indium oxide powder was not calcinated. Then, these calcinated powder and not calcinated powder were mixed again using the wet-type ball mill. After the mixing, slurry was filtered, and dried to obtain secondary mixed powder. Subsequently, this secondary mixed powder was granulated. Next, the granulated powder was filled into a forming die to form a tablet shape, by applying a pressure of 9.8 MPa, using a single screw press machine. The tablet was formed in advance so as to attain dimension after sintering of a diameter of 30 mm, and a height of 40 mm.

Next, the compact was sintered as follows. Under atmosphere where oxygen was introduced into air inside the furnace, in a ratio of 5 litter/minute, per 0.1 m³ of inner volume of the furnace, sintering was performed at a sintering temperature of 1250° C. for 20 hours. In this case, temperature was raised in a temperature rising rate of 1° C./min, and was lowered in a temperature falling rate of 10° C./min down to 1000° C., while stopping oxygen introduction at cooling after sintering.

Composition analysis of the resultant oxide sintered body was performed by an ICP emission spectrometry, and it was confirmed to be nearly the same as charging composition in weighing of raw material powder. Density of the oxide sintered body was measured and found to be 4.90 g/cm³.

Next, phase identification of the oxide sintered body was performed by X-ray diffraction measurement. It was confirmed that the oxide sintered body is composed of the $In_2O_3$ phase with a bixbyite type structure, and the $In_6WO_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. In addition, it has been clear that titanium exists together not only in the crystal grain where tungsten exists but also in the crystal grain where tungsten does not exist. Accordingly, it has become clear that there exist at least the crystal grain composed of the indium oxide phase, where tungsten does not make a solid solution, at least the crystal grain composed of the indium oxide phase, where tungsten is present as a solid solution, and the crystal grain composed of the $In_6WO_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase and the crystal grain composed of the $In_6WO_{12}$ phase of the indium tungstate compound exist. Next, as a result of point analysis using EDS, it was confirmed that, in the crystal grain composed of the indium oxide phase, there exist both the crystal grain not containing tungsten and the crystal grain containing tungsten. It was confirmed that titanium exists both in the crystal grain where tungsten is contained and in the crystal grain where tungsten is not contained.

From a result of the above analysis, it was confirmed that in the oxide sintered body of the present Example, there exist at least the crystal grain (A) composed of the indium oxide phase with a bixbyite type structure, where tungsten does not make a solid solution, at least the crystal grain (B) composed of the indium oxide phase with a bixbyite type structure, where tungsten is present as a solid solution, and the crystal grain (C) composed of the $In_6WO_{12}$ phase of the indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable, for similar discharging. To investigate film formation stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be $2.7 \times 10^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten and titanium are in a solid solution state in the indium oxide phase.

Example 10

An oxide sintered body along with a tablet for ion plating were prepared by a similar method as in Example 9, except that indium oxide powder, tungsten oxide powder and titanium oxide powder having an average particle diameter of 1.5 μm or smaller were used as raw material powder, and the powder were weighed, so that tungsten content is 0.10, as atom number ratio represented by W/(In+W Ti) and titanium content is 0.05, as atom number ratio represented by Ti/(In+W+Ti).

Composition analysis of the resultant oxide sintered body was performed by an ICP emission spectrometry, and it was confirmed to be nearly the same as charging composition in weighing of raw material powder. Density of the oxide sintered body was measured and found to be 4.98 g/cm³.

Next, phase identification of the oxide sintered body was performed by X-ray diffraction measurement. As a result, it was confirmed that the oxide sintered body is composed of the $In_2O_3$ phase and the $In_6WO_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. In addition, it has been clear that titanium exists together not only in the crystal grain where tungsten exists but also in the crystal grain where tungsten does not exist. Accordingly, it has become clear that there exist at least the crystal grain composed of the indium oxide phase, where tungsten does not make a solid solution, at least the crystal grain composed of the indium oxide phase, where tungsten is present as a solid solution, and the crystal grain composed of the $In_6WO_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase and the crystal grain composed of the $In_6WO_{12}$ phase of the indium tungstate compound exist. Next, as a result of point analysis using EDS, it was confirmed that, in the crystal grain composed of the indium oxide phase, there exist both the crystal grain not containing tungsten and the crystal grain containing tungsten. It was confirmed that titanium exists both in the crystal grain where tungsten is contained and in the crystal grain where tungsten is not contained.

From a result of the above analysis, it was confirmed that in the oxide sintered body of the present Example, there exist at least the crystal grain (A) composed of the indium oxide phase with a bixbyite type structure, where tungsten does not make a solid solution, at least the crystal grain (B) composed of the indium oxide phase with a bixbyite type structure, where tungsten is present as a solid solution, and the crystal grain (C) composed of the $In_6WO_{12}$ phase of the indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable, for similar discharging. To investigate discharge stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be $4.9 \times 10^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten and titanium are in a solid solution state in the indium oxide phase.

Example 11

Indium oxide powder, tungsten oxide powder and zirconium oxide powder having an average particle diameter of 1.5 μm or smaller were used as raw material powder. The powder were weighed, so that tungsten content is 0.006, as atom number ratio represented by W/(In+W+Zr), and zirconium content is 0.006, as atom number ratio represented by Zr/(In+W+Zr). 50% by weight of the indium oxides powder and the whole amount of the tungsten oxide powder, among them, were charged in a pot made of a resin, together with water and a dispersing agent or the like to be mixed in a wet-type ball mill. In this case, hard-type $ZrO_2$ balls were used, and mixing time was set to 18 hours. After the mixing, slurry was taken out, filtered, and dried to obtain primary mixed powder. Subsequently, temperature of the primary mixed powder was raised in a temperature rising rate of 1° C./min in a sintering furnace, and calcination was performed under condition of 1250° C. for 10 hours. Residual indium oxide powder and zirconium oxide were not calcinated. Then, these calcinated powder and not calcinated powder were mixed again using the wet-type ball mill. After the mixing, slurry was filtered, and dried to obtain secondary mixed powder. Subsequently, this secondary mixed powder was granulated. Next, the granulated powder was filled into a forming die to form a tablet shape, by applying a pressure of 9.8 MPa, using a single screw press machine. The tablet was formed in advance so as to attain dimension after sintering of a diameter of 30 mm, and a height of 40 mm.

Next, the compact was sintered as follows. Under atmosphere where oxygen was introduced into air inside the furnace, in a ratio of 5 litter/minute, per 0.1 m³ of inner volume of the furnace, sintering was performed at a sintering temperature of 1250° C. for 20 hours. In this case, temperature was raised in a temperature rising rate of 1° C./min, and was lowered in a temperature falling rate of 10° C./min down to 1000° C., while stopping oxygen introduction at cooling after sintering.

Composition analysis of the resultant oxide sintered body was performed by an ICP emission spectrometry, and it was confirmed to be nearly the same as charging composition in weighing of raw material powder. Density of the oxide sintered body was measured and found to be 4.88 g/cm³.

Next, phase identification of the oxide sintered body was performed by X-ray diffraction measurement. It was confirmed that the oxide sintered body is composed of the $In_2O_3$ phase with a bixbyite type structure, and the $In_6WO_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. In addition, it has been clear that zirconium exists together not only in the crystal grain where tungsten exists but also in the crystal grain where tungsten does not exist. Accordingly, it has become clear that there exist at least the crystal grain composed of the indium oxide phase, where tungsten does not make a solid solution, at least the crystal grain composed of the indium oxide phase, where tungsten is present as a solid solution, and the crystal grain composed of the $In_6WO_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase and the crystal grain composed of the $In_6WO_{12}$ phase of the indium tungstate compound exist. Next, as a result of point analysis using EDS, it was confirmed that, in the crystal grain composed of the indium oxide phase, there exist both the crystal grain not containing tungsten and the crystal grain containing tungsten. It was confirmed that zirconium exists both in the crystal grain where tungsten is contained and in the crystal grain where tungsten is not contained.

From a result of the above analysis, it was confirmed that in the oxide sintered body of the present Example, there exist at least the crystal grain (A) composed of the indium oxide phase with a bixbyite type structure, where tungsten does not make a solid solution, at least the crystal grain (B) composed of the indium oxide phase with a bixbyite type structure, where tungsten is present as a solid solution, and the crystal grain (C) composed of the $In_6WO_{12}$ phase of the indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable, for similar discharging. To investigate film formation stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be $2.8 \times 10^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten and zirconium are in a solid solution state in the indium oxide phase.

Example 12

An oxide sintered body along with a tablet for ion plating were prepared by a similar method as in Example 11, except that hafnium oxide powder was used instead of the zirconium oxide powder, and they were weighed, so that tungsten content is 0.006, as atom number ratio represented by W/(In+W+Hf) and hafnium content is 0.06, as atom number ratio represented by Hf/(In +W+Hf).

Composition analysis of the resultant oxide sintered body was performed by an ICP emission spectrometry, and it was confirmed to be nearly the same as charging composition in weighing of raw material powder. Density of the oxide sintered body was measured and found to be 4.86 g/cm$^3$.

Next, phase identification of the oxide sintered body was performed by X-ray diffraction measurement. It was confirmed that the oxide sintered body is composed of the In$_2$O$_3$ phase with a bixbyite type structure, and the In$_6$WO$_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. In addition, it has been clear that hafnium exists together not only in the crystal grain where tungsten exists but also in the crystal grain where tungsten does not exist. Accordingly, it has become clear that there exist at least the crystal grain composed of the indium oxide phase, where tungsten does not make a solid solution, at least the crystal grain composed of the indium oxide phase, where tungsten is present as a solid solution, and the crystal grain composed of the In$_6$WO$_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase and the crystal grain composed of the In$_3$WO$_{12}$ phase of the indium tungstate compound exist. Next, as a result of point analysis using EDS, it was confirmed that, in the crystal grain composed of the indium oxide phase, there exist both the crystal grain not containing tungsten and the crystal grain containing tungsten. It was confirmed that hafnium exists both in the crystal grain where tungsten is contained and in the crystal grain where tungsten is not contained.

From a result of the above analysis, it was confirmed that in the oxide sintered body of the present Example, there exist at least the crystal grain (A) composed of the indium oxide phase with a bixbyite type structure, where tungsten does not make a solid solution, at least the crystal grain (B) composed of the indium oxide phase with a bixbyite type structure, where tungsten is present as a solid solution, and the crystal grain (C) composed of the In$_6$WO$_{12}$ phase of the indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable, for similar discharging. To investigate film formation stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be 2.8×10$^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten and hafnium are in a solid solution state in the indium oxide phase.

Example 13

Indium oxide powder, tungsten oxide powder, titanium oxide powder, molybdenum oxide powder having an average particle diameter of 1.5 μm or smaller were used as raw material powder. The powder were weighed, so that tungsten content is 0.006, as atom number ratio represented by W/(In+W+Ti+Mo), titanium content is 0.006, as atom number ratio represented by Ti/(In +W+Ti+Mo), and molybdenum content is 0.006, as atom number ratio represented by Mo(In+W+Ti+Mo). 50% by weight of the indium oxides powder and the whole amount of the tungsten oxide powder and titanium oxide powder, among them, were charged in a pot made of a resin, together with water and a dispersing agent or the like to be mixed in a wet-type ball ill. In this case, hard-type ZrO$_2$ balls were used, and mixing time was set to 18 hours. After the mixing, slurry was taken out, filtered, and dried to obtain primary mixed powder. Subsequently, temperature of the primary mixed powder was raised in a temperature rising rate of 1° C./min in a sintering furnace, and calcination was performed under condition of 1250° C. for 10 hours. Residual indium oxide powder, and the molybdenum oxide powder were not calcinated. Then, the above calcinated powder and the non-calcinated powder were mixed again using wet-type ball mill. After the mixing, slurry was filtered, and dried to obtain secondary mixed powder. Subsequently, this secondary mixed powder was granulated. Next, the granulated powder was filled into a forming die to form a tablet shape, by applying a pressure of 9.3 MPa, using a single screw press machine. The tablet was formed in advance so as to attain dimension after sintering of a diameter of 30 mm, and a height of 40 mm.

Next, the compact was sintered as follows. Under atmosphere where oxygen was introduced into air inside the furnace, in a ratio of 5 litter/minute, per 0.1 m$^3$ of inner volume of the furnace, sintering was performed at a sintering temperature of 1250° C. for 20 hours. In this case, temperature was raised in a temperature rising rate of 1° C./min, and was lowered in a temperature falling rate of 10° C./min down to 1000° C., while stopping oxygen introduction at cooling after sintering.

Composition analysis of the resultant oxide sintered body was performed by an ICP emission spectrometry, and it was confirmed to be nearly the same as charging composition in weighing of raw material powder. Density of the oxide sintered body was measured and found to be 4.91 g/cm$^3$.

Next, phase identification of the oxide sintered body was performed by X-ray diffraction measurement. As a result, it was confirmed that the oxide sintered body is composed of the In$_2$O$_3$ phase with a bixbyite type structure, and the In$_6$WO$_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. In addition, it has been clear that titanium and molybdenum exist together not only in the crystal grain where tungsten exists but also in the crystal grain where tungsten does not exist. Accordingly, it has become clear that there exist at least the crystal grain composed of the indium oxide phase, where tungsten does not make a solid solution, at least the crystal grain composed of the indium oxide phase, where tungsten is present as a solid solution, and the crystal grain composed of the In$_6$WO$_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase and the crystal grain composed of the In$_6$WO$_{12}$ phase of the indium tungstate compound exist. Next, as a result of point analysis using EDS, it was confirmed that, in the crystal grain composed of the indium oxide phase, there exist both the crystal grain not containing tungsten and the crystal grain containing tungsten. It was confirmed that titanium and molybdenum exist both in the crystal grain not containing tungsten and the crystal grain containing tungsten.

From a result of the above analysis, it was confirmed that in the oxide sintered body of the present Example, there exist at least the crystal grain (A) composed of the indium oxide phase with a bixbyite type structure, where tungsten does not make a solid solution, at least the crystal grain (B) composed of the indium oxide phase with a bixbyite type structure, where tungsten is present as a solid solution, and the crystal grain (C) composed of the In$_6$WO$_{12}$ phase of the indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable, for similar discharge. To investigate film formation stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be 2.9×10$^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase where tungsten, titanium and molybdenum are in a solid solution state in the indium oxide phase.

Example 14

Indium oxide powder and tungsten oxide powder having an average particle diameter of 1.5 μm or smaller were used as raw material powder. The powder were weighed, so that tungsten content is 0.006, as atom number ratio represented by W/(In +W). 60% by weight of the indium oxides powder and the whole amount of the tungsten oxide powder, among them, were charged in a pot made of a resin, together with water and a dispersing agent or the like to be mixed in a wet-type ball mill. In this case, hard-type ZrO$_2$ balls were used, and mixing time was set to 18 hours. After the mixing, slurry was taken out, filtered, and dried to obtain primary mixed powder. Subsequently, temperature of the primary mixed powder was raised in a temperature rising rate of 1° C./min in a sintering furnace, and calcination was performed under condition of 1000° C. for 10 hours. Residual indium oxide powder was not calcinated. Then, the above calcinated powder and the non-calcinated powder were mixed again using wet-type ball mill. After the mixing, slurry was filtered, and dried to obtain secondary mixed powder. Subsequently, this secondary mixed powder was granulated. Next, the granulated powder was filled into a forming die to form a tablet shape, by applying a pressure of 4.9 MPa, using a single screw press machine. The tablet was formed in advance so as to attain dimension after sintering of a diameter of 30 mm, and a height of 40 mm.

Next, the compact was sintered as follows. Under atmosphere where oxygen was introduced into air inside the furnace, in a ratio of 5 litter/minute, per 0.1 m$^3$ of inner volume of the furnace, sintering was performed at a sintering temperature of 1000° C. for 20 hours. In this case, temperature was raised in a temperature rising rate of 1° C./min, and was lowered in a temperature falling rate of 10° C./min down to 1000° C., while stopping oxygen introduction at cooling after sintering.

Composition analysis of the resultant oxide sintered body was performed by an ICP emission spectrometry, and it was confirmed to be nearly the same as charging composition in weighing of raw material powder. Density of the oxide sintered body was measured and found to be 3.41 g/cm$^3$.

Next, phase identification of the oxide sintered body was performed by X-ray diffraction measurement. As a result, it was confirmed that the oxide sintered body is composed of the In$_2$O$_3$ phase with a bixbyite type structure, and the In$_6$WO$_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. That is, it has become clear that there exist the crystal grain composed of the indium oxide phase, where tungsten does not make a solid solution, the crystal grain composed of the indium oxide phase, where tungsten is present as a solid solution, and the crystal grain composed of the In$_6$WO$_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase and the crystal grain composed of the $In_6WO_{12}$ phase of the indium tungstate compound exist. Next, as a result of point analysis using EDS, it was confirmed that, in the crystal grain composed of the indium oxide phase, there exist both the crystal grain not containing tungsten and the crystal grain containing tungsten.

From a result of the above analysis, it was confirmed that in the oxide sintered body of the present Example, there exist the crystal grain (A) composed of the indium oxide phase with a bixbyite type structure, where tungsten does not make a solid solution, the crystal grain (B) composed of the indium oxide phase with a bixbyite type structure, where tungsten is present as a solid solution, and the crystal grain (C) composed of the $In_6WO_{12}$ phase of the indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable, for similar discharge. To investigate discharge stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be $2.7 \times 10^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten is in a solid solution state in the indium oxide phase.

Example 15

Indium oxide powder and tungsten oxide powder having an average particle diameter of 1.5 μm or smaller were used as raw material powder. The powder were weighed, so that tungsten content is 0.006, as atom number ratio represented by W/(In+W). 20% by weight of the indium oxides powder and the whole amount of the tungsten oxide powder, among them, were charged in a pot made of a resin, together with water and a dispersing agent or the like to be mixed in a wet-type ball mill. In this case, hard-type $ZrO_2$ balls were used, and mixing time was set to 18 hours. After the mixing, slurry was taken out, filtered, and dried to obtain primary mixed powder. Subsequently, temperature of the primary mixed powder was raised in a temperature rising rate of 1° C./min in a sintering furnace, and calcination was performed under condition of 1450° C. for 10 hours. Residual indium oxide powder was not calcinated. Then, the above calcinated powder and the non-calcinated powder were mixed again using wet-type ball mill. After the mixing, slurry was filtered, and dried to obtain secondary mixed powder. Subsequently, this secondary mixed powder was granulated. Next, the granulated powder was filled into a forming die to form a tablet shape, by applying a pressure of 9.8 MPa, using a single screw press machine. The tablet was formed in advance so as to attain dimension after sintering of a diameter of 30 mm, and a height of 40 mm.

Next, the compact was sintered as follows. Under atmosphere where oxygen was introduced into air inside the furnace, in a ratio of 5 litter/minute, per 0.1 m³ of inner volume of the furnace, sintering was performed at a sintering temperature of 1450° C. for 20 hours. In this case, temperature was raised in a temperature rising rate of 1° C./min, and was lowered in a temperature falling rate of 10° C./min down to 1000° C., while stopping oxygen introduction at cooling after sintering.

Composition analysis of the resultant oxide sintered body was performed by an ICP emission spectrometry, and it was confirmed to be nearly the same as charging composition in weighing of raw material powder. Density of the oxide sintered body was measured and found to be 5.47 g/cm³.

Next, phase identification of the oxide sintered body was performed by X-ray diffraction measurement. As a result, it was confirmed that the oxide sintered body is composed of the $In_2O_3$ phase with a bixbyite type structure, and the $In_6WO_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. That is, it has become clear that there exist the crystal grain composed of the indium oxide phase, where tungsten does not make a solid solution, the crystal grain composed of the indium oxide phase, where tungsten is present as a solid solution, and the crystal grain composed of the $In_6WO_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase and the crystal grain composed of the $In_6WO_{12}$ phase of the indium tungstate compound exist. Next, as a result of point analysis using EDS, it was confirmed that, in the crystal grain composed of the indium oxide phase, there exist both the crystal grain not containing tungsten and the crystal grain containing tungsten.

From a result of the above analysis, it was confirmed that in the oxide sintered body of the present Example, there exist the crystal grain (A) composed of the indium oxide phase with a bixbyite type structure, where tungsten does not make a solid solution, the crystal grain (B) composed of the indium oxide phase with a bixbyite type structure, where tungsten is present as a solid solution, and the crystal grain (C) composed of the $In_6WO_{12}$ phase of the indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable, for similar discharge. To investigate discharge stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was nearly the same as that of the tablet.

By measurement of specific resistance of the film, it was found to be $2.5 \times 10^{-4}$ Ω·cm. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten is in a solid solution state in the indium oxide phase.

Example 16

An oxide sintered body along with a tablet for ion plating were prepared by a similar method as in Example 1, except that the indium oxide powder having an average particle diameter of 1.5 μm or smaller, and the tungsten oxide powder having an average particle diameter of 4 μm were used as raw material powder, and mixing time in the a wet-type ball mill was changed to 8 hours.

Composition analysis of the resultant oxide sintered body was performed by an ICP emission spectrometry, and it was confirmed to be nearly the same as charging composition in weighing of raw material powder. Density of the oxide sintered body was measured and found to be 4.15 g/cm$^3$.

Next, phase identification of the oxide sintered body was performed by X-ray diffraction measurement. It was confirmed that the oxide sintered body is composed of the $In_2O_3$ phase with a bixbyite type structure, and the $In_6WO_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. However, it was confirmed that in the crystal grains where tungsten exists, such crystal grain is contained a little where indium does not exist and only tungsten and oxygen exist. As a result of image analysis at 30 points of view fields, area of the crystal grain where indium does not exist and only tungsten and oxygen exist is 2.9% based on total crystal grains. That is, it has been clarified that there is further present the crystal grain composed of the tungsten oxide phase, other than the crystal grain composed of the indium oxide phase, where tungsten does not make a solid solution, the crystal grain composed of the indium oxide phase, where tungsten is present as a solid solution, and the crystal grain composed of the $In_6WO_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase and the crystal grain composed of the $In_6WO_{12}$ phase of the indium tungstate compound exist. Next, as a result of point analysis using EDS, it was confirmed that, in the crystal grain composed of the indium oxide phase, there exist both the crystal grain not containing tungsten and the crystal grain containing tungsten.

From a result of the above analysis, it was confirmed that in the oxide sintered body of the present Example, there exist at least the crystal grain (A) composed of the indium oxide phase with a bixbyite type structure, where tungsten does not make a solid solution, at least the crystal grain (B) composed of the indium oxide phase with a bixbyite type structure, where tungsten is present as a solid solution, and the crystal grain (C) composed of the $In_6WO_{12}$ phase of the indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable, for similar discharging. To investigate film formation stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that, also in this case, there was no generation of a problem of crack, fracture or splash, however, film formation speed is decreased to 93%, as compared with Example 1. It should be noted that the composition of the resultant transparent conductive film was confirmed nearly the same as that of the tablet.

By measurement of specific resistance of the film, it was found to be $3.0 \times 10^{-4}$ Ω·cm, a little higher than that in Example 1. In addition, by measurement of transmittance, both average transmittance in a visible range and transmittance at a wavelength of 1000 nm were found to be over 85%. Crystallinity of the film was investigated by X-ray diffraction measurement, and confirmed to be a crystalline film composed of the indium oxide phase only, and tungsten is in a solid solution state in the indium oxide phase.

Comparative Example 1

An oxide sintered body along with a tablet for ion plating were prepared by a similar method as in Example 1, except that raw material powder was weighed so that tungsten content becomes 0.0005, as atom number ratio represented by W/(In+W).

Composition analysis of the resultant oxide sintered body was performed by an ICP emission spectrometry, and it was confirmed to be nearly the same as charging composition in weighing of raw material powder. Density of the oxide sintered body was measured and found to be 4.70 g/cm$^3$.

Next, phase identification of the oxide sintered body was performed by X-ray diffraction measurement. It was confirmed that the oxide sintered body is composed of only the $In_2O_3$ phase with a bixbyite type structure. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. That is, it has been clarified that there exists the crystal grain composed of the indium oxide phase, where tungsten does not make a solid solution, and the crystal grain composed of the indium oxide phase, where tungsten is present as a solid solution. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase exists. Next, as a result of point analysis using EDS, it was confirmed that, in the crystal grain composed of the indium oxide phase, there exist both the crystal grain not containing tungsten and the crystal grain containing tungsten.

From a result of the above analysis, it was confirmed that in the oxide sintered body of the present Example, there exist the crystal grain (A) composed of the indium oxide phase with a bixbyite type structure, where tungsten does not make a solid solution, and the crystal grain (B) composed of the indium oxide phase with a bixbyite type structure, where tungsten is present as a solid solution, and the crystal grain (C) composed of indium tungstate compound does not exist.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable, for similar discharging. To investigate film formation stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film was confirmed nearly the same as that of the tablet.

By measurement of specific resistance of the film, it was found to be $9.3 \times 10^{-4}$ Ω·cm, that is, over than $5.0 \times 10^{-4}$ Ω·cm. In addition, by measurement of transmittance, average transmittance in a visible range was found to be over 85%, however, transmittance at a wavelength of 1000 nm was found to be a little lower than 85%. Crystallinity of the film was investigated by X-ray diffraction measurement, and confirmed to be a crystalline film composed of the indium oxide phase only, and tungsten is in a solid solution state in the indium oxide phase.

Comparative Example 2

An oxide sintered body along with a tablet for ion plating were prepared by a similar method as in Example 1, except that raw material powder was weighed so that tungsten content becomes 0.17, as atom number ratio represented by W/(In+W).

Composition analysis of the resultant oxide sintered body was performed by an ICP emission spectrometry, and it was confirmed to be nearly the same as charging composition in weighing of raw material powder. Density of the oxide sintered body was measured and found to be 4.89 g/cm³.

Next, phase identification of the oxide sintered body was performed by X-ray diffraction measurement. It was confirmed that the oxide sintered body is composed of the $In_2O_3$ phase with a bixbyite type structure and the $In_6WO_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. That is, it has been clarified that there exists the crystal grain composed of the indium oxide phase, where tungsten does not make a solid solution, the crystal grain composed of the indium oxide phase, where tungsten is present as a solid solution, and the crystal grain composed of the $In_6WO_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase and the crystal grain composed of the $In_6WO_{12}$ phase of the indium tungstate compound exist. Next, as a result of point analysis using EDS, it was confirmed that, in the crystal grain composed of the indium oxide phase, there exist both the crystal grain not containing tungsten and the crystal grain containing tungsten.

From a result of the above analysis, it was confirmed that in the oxide sintered body of the present Example, there exist the crystal grain (A) composed of the indium oxide phase with a bixbyite type structure, where tungsten does not make a solid solution, and the crystal grain (B) composed of the indium oxide phase with a bixbyite type structure, where tungsten is present as a solid solution, and the crystal grain (C) composed of indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable, for similar discharging. To investigate film formation stability of the tablet, specifically, it was observed whether a problem of crack, fracture or splash is generated or not, till 10 pieces of the tablets became not usable, however, a specific troublesome phenomenon was not generated.

After exchanging to a new tablet, film formation was performed. As a substrate a 7059 substrate manufactured by Corning Co., Ltd. was used, to form a transparent conductive film with a film thickness of 200 nm, at a substrate temperature of 300° C. It was confirmed that the composition of the resultant transparent conductive film is nearly the same as that of the tablet.

By measurement of specific resistance of the film, it was found to be $8.2 \times 10^{-4}$ Ω·cm, that is, over than $5.0 \times 10^{-4}$ Ω·cm. In addition, by measurement of transmittance, average transmittance in a visible range was found to be over 85%, however, transmittance at a wavelength of 1000 nm was found to be a little lower than 85%. Crystallinity of the film was investigated by X-ray diffraction measurement, and confirmed to be a crystalline film composed of the indium oxide phase only, and tungsten is in a solid solution state in the indium oxide phase.

Comparative Example 3

An oxide sintered body along with a tablet for ion plating were prepared by a similar method as in Example 1, except that the whole amount of indium oxide powder and the whole amount of tungsten oxide powder weighed were charged in a pot made of a resin, together with water and a dispersing agent or the like to be mixed in a wet-type ball mill, and after that slurry was taken out, filtered, and dried to obtain primary mixed powder, as well as this primary mixed powder was granulated as it is, compacted and sintered.

Composition analysis of the resultant oxide sintered body was performed by an ICP emission spectrometry, and it was confirmed to be nearly the same as charging composition in weighing of raw material powder. Density of the oxide sintered body was measured and found to be 4.74 g/cm$^3$.

Next, phase identification of the oxide sintered body was performed by X-ray diffraction measurement. It was confirmed that the oxide sintered body is composed of the $In_2O_3$ phase with a bixbyite type structure and the $In_6WO_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, tungsten exists in all of the crystal grains. That is, it has been clarified that there does not exist the crystal grain composed of the indium oxide phase, where tungsten does not make a solid solution, and there exist the crystal grain composed of the indium oxide phase, where tungsten is present as a solid solution, and the crystal grain composed of the $In_6WO_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase and the crystal grain composed of the $In_3WO_{12}$ phase of the indium tungstate compound exist. Next, as a result of point analysis using EDS, it was confirmed that the crystal grain composed of the indium oxide phase has only the crystal grain containing tungsten.

From a result of the above analysis, it was confirmed that in the oxide sintered body of the present Example, there exist the crystal grain (B) composed of the indium oxide phase with a bixbyite type structure, where tungsten is present as a solid solution, and the crystal grain (C) composed of indium tungstate compound, and there does not exist the crystal grain (A) composed of the indium oxide phase with a bixbyite type structure, where tungsten does not make a solid solution.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable, for similar discharging. To investigate film formation stability of the tablet, specifically, it was observed whether a problem of crack, fracture or splash is generated or not, till 10 pieces of the tablets became not usable. Before reaching film formation time predicted to become not usable of the tablet under a normal use state, in two pieces among 10 pieces of the tablets, crack generated. By investigation of the crack generation state, it has been found that crack generated at many places of the tablet, and final fracture made impossible to continue discharge. It should be noted that upon receiving the result of the fracture of the tablet, film formation was not performed.

Comparative Example 4

Indium oxide powder and tungsten oxide powder having an average particle diameter of 1.5 μm or smaller were used as raw material powder. The powder were weighed, so that tungsten content is 0.003, as atom number ratio represented by W/(In +W). 50% by weight of the indium oxides powder and the whole amount of the tungsten oxide powder, among them, were charged in a pot made of a resin, together with water and a dispersing agent or the like to be mixed in a wet-type ball mill. In this case, hard-type $ZrO_2$ balls were used, and mixing time was set to 18 hours. After the mixing, slurry was taken out, filtered, and dried to obtain primary mixed powder. Subsequently, temperature of the primary mixed powder was raised in a temperature rising rate of 1° C./min in a sintering furnace, and calcination was performed under condition of 900° C. for 10 hours, different from Example 4. Residual indium oxide powder was not calcinated. Then, the above calcinated powder and the non-calcinated powder were mixed again using wet-type ball mill. After the mixing, slurry was filtered, and dried to obtain secondary mixed powder. Subsequently, this secondary mixed powder was granulated. Next, the granulated powder was filled into a forming die to form a tablet shape, by applying a pressure of 4.9 MPa, using a single screw press machine. The tablet was formed in advance so as to attain dimension after sintering of a diameter of 30 mm, and a height of 40 mm.

Next, the compact was sintered as follows. Under atmosphere where oxygen was introduced into air inside the furnace, in a ratio of 5 litter/minute, per 0.1 m$^3$ of inner volume of the furnace, sintering was performed at a sintering temperature of 900° C. for 20 hours. In this case, temperature was raised in a temperature rising rate of ° C./min, oxygen introduction was stopped at cooling after sintering.

Composition analysis of the resultant oxide sintered body was performed by an ICP emission spectrometry, and it was confirmed to be nearly the same as charging composition in weighing of raw material powder. Density of the oxide sintered body was measured and found to be 3.13 g/cm$^3$.

Next, phase identification of the oxide sintered body was performed by X-ray diffraction measurement. It was confirmed that the oxide sintered body is composed only of the $In_2O_3$ phase with a bixbyite type structure. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. That is, it has become clear that there exist the crystal grain composed of the indium oxide phase, where tungsten does not make a solid solution, and the crystal grain composed of the indium oxide phase, where tungsten is present as a solid solution. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase, and the crystal grain composed of the indium tungstate compound has not been confirmed. Next, as a result of point analysis using EDS, it was confirmed that, in the crystal grain composed of the indium oxide phase, there exist both the crystal grain not containing tungsten and the crystal grain containing tungsten.

From a result of the above analysis, it was confirmed that in the oxide sintered body of the present Example, there exist the crystal grain (A) composed of the indium oxide phase with a bixbyite type structure, where tungsten does not make a solid solution, and the crystal grain (B) composed of the indium oxide phase with a bixbyite type structure, where tungsten is present as a solid solution, and the crystal grain (C) composed of the $In_6WO_{12}$ phase of the indium tungstate compound does not exist.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable, for similar discharge. To investigate discharge stability of the tablet, specifically, it was observed whether a problem of crack, fracture or splash is generated or not, till 10 pieces of the tablets became not usable. Before reaching film formation time predicted to become not usable of the tablet under a normal use state, in four pieces among 10 pieces of the tablets, crack generated. By investigation of the crack generation state, it has been found that crack generated at many places of the tablet, and final fracture made impossible to continue discharge. It should be noted that upon receiving the result of the fracture of the tablet, film formation was not performed.

Comparative Example 5

Indium oxide powder and tungsten oxide powder having an average particle diameter of 1.5 μm or smaller were used as raw material powder. The powder were weighed, so that tungsten content is 0.006, as atom number ratio represented by W/(In +W). 18% by weight of the indium oxides powder and the whole amount of the tungsten oxide powder, among them, were charged in a pot made of a resin, together with water and a dispersing agent or the like to be mixed in a wet-type ball mill. In this case, hard-type $ZrO_2$ balls were used, and mixing time was set to 18 hours. After the mixing, slurry was taken out, filtered, and dried to obtain primary mixed powder. Subsequently, temperature of the primary mixed powder was raised in a temperature rising rate of 1° C./min in a sintering furnace, and calcination was performed under condition of 1450° C. for 10 hours, different from Example 1. Residual indium oxide powder was not calcinated. Then, the above calcinated powder and the non-calcinated powder were mixed again using wet-type ball mill. After the mixing, slurry was filtered, and dried to obtain secondary mixed powder. Subsequently, this secondary mixed powder was granulated. Next, the granulated powder was filled into a forming die to form a tablet shape, by applying a pressure of 196 MPa, using a cold isostatic press. The tablet was formed in advance so as to attain dimension after sintering of a diameter of 30 mm, and a height of 40 mm.

Next, the compact was sintered as follows. Under atmosphere where oxygen was introduced into air inside the furnace, in a ratio of 5 litter/minute per $0.1 m^3$ of inner volume of the furnace, sintering was performed at a sintering temperature of 1450° C. for 20 hours, different from Example 1. In this case, temperature was raised in a temperature rising rate of 1° C./min, oxygen introduction was stopped at cooling after sintering.

Composition analysis of the resultant oxide sintered body was performed by an ICP emission spectrometry, and it was confirmed to be nearly the same as charging composition in weighing of raw material powder. Density of the oxide sintered body was measured and found to be 5.88 $g/cm^3$.

Next, phase identification of the oxide sintered body was performed by X-ray diffraction measurement. It was confirmed that the oxide sintered body is composed of the $In_2O_3$ phase with a bixbyite type structure and the $In_6WO_{12}$ phase of the indium tungstate compound. Subsequently, texture observation of the oxide sintered body and composition analysis of the crystal grain were performed, using SEM-EDS. It has been clear that, as a result of surface analysis of element distribution using EDS, there are the crystal grain where tungsten exists, and the crystal grain where tungsten does not exist. That is, it has become clear that there exist the crystal grain composed of the indium oxide phase, where tungsten does not make a solid solution, the crystal grain composed of the indium oxide phase, where tungsten is present as a solid solution, and the crystal grain composed of the $In_6WO_{12}$ phase of the indium tungstate compound. It should be noted that any of the crystal grains has a particle diameter of over about 1 μm.

Still more, texture observation of each crystal grain in the oxide sintered body using TEM-EDS, electron-beam diffraction measurement and composition analysis were performed. As a result of the electron-beam diffraction measurement, it was confirmed that the crystal grain composed of the indium oxide phase, and the crystal grain composed of the indium tungstate compound exist. Next, as a result of point analysis using EDS, it was confirmed that, in the crystal grain composed of the indium oxide phase, there exist both the crystal grain not containing tungsten and the crystal grain containing tungsten.

From a result of the above analysis, it was confirmed that in the oxide sintered body of the present Example, there exist the crystal grain (B) composed of the indium oxide phase with a bixbyite type structure, where tungsten is present as a solid solution, and the crystal grain (C) composed of the $In_6WO_{12}$ phase of the indium tungstate compound.

This oxide sintered body was processed to the tablet, and discharge using a plasma gun by an ion plating method was continued, until the tablet became not usable. As an ion plating apparatus, similarly as in Example 1, a reactive plasma vapor deposition apparatus was used, where high density plasma assisted vacuum deposition method (HDPE method) is applicable, for similar discharge. To investigate discharge stability of the tablet, specifically, it was observed whether a problem of crack, fracture or splash is generated or not, till 10 pieces of the tablets became not usable. Before reaching film formation time predicted to become not usable of the tablet under a normal use state, in five pieces among 10 pieces of the tablets, crack generated. By investigation of the crack generation state, it has been found that crack generated at many places of the tablet, and final fracture made impossible to continue discharge. It should be noted that upon receiving the result of the fracture of the tablet, film formation was not performed.

[Evaluation]

The oxide sintered bodies of Examples 1 to 8, according to the present invention, use indium oxide powder and tungsten oxide powder having an average particle diameter of 1.5 μm or smaller, as raw material powder, and contain indium oxide as a main component and tungsten as an additive element, wherein content of tungsten being 0.001 to 0.15, as an atomic ratio of W/(In+W).

Among these, in Examples 1 to 7, because the oxide sintered body was prepared using the secondary mixed powder obtained by still more mixing, calcinated powder obtained by calcination of the primary mixed powder composed of 50% by weight of the indium oxides powder and the whole amount of the tungsten oxide powder, in the indium oxide powder and the tungsten oxides powder weighed, so as to attain predetermined composition; and the non-calcinated powder composed of the residual indium oxide powder, as is clear from the result shown in Table 1, the crystal grain (A) composed of the indium oxide phase with a bixbyite type structure, where tungsten does not make a solid solution, and the crystal grain (B) composed of the indium oxide phase with a bixbyite type structure, where tungsten is present as a solid solution exist, in any of the oxide sintered bodies. It should be noted that among Examples 1 to 6, in Examples 3 and 4, the crystal grain (C) composed of the indium tungstate compound phase does not exist. Density of these oxide sintered bodies is within a range of 4.7 to 5.0 g/cm$^3$, and it is not necessarily high, that is around 70% of theoretical density, however, it was confirmed that crack, fracture or splash is not generated in film formation by an ion plating method. That is, the oxide sintered bodies of Examples 1 to 7 can be said to have strength endurable against heat shock or thermal expansion in film formation by an ion plating method, even if density of the sintered body is low, by being mainly composed of the crystal grain (A) composed of the indium oxide phase with a bixbyite type structure, where tungsten does not make a solid solution, and the crystal grain (B) composed of the indium oxide phase with a bixbyite type structure, where tungsten is present as a solid solution. The resultant film shows a specific resistance of 5.0×10$^{-4}$ Ω·cm or smaller, and a transmittance at a wavelength of 1000 nm of 80% or higher, thus clearly shows sufficient applicability as a transparent electrode for a solar cell.

In Example 8, although the residual indium oxide powder was also calcinated to powder, even in that case, because it is composed of the crystal grain similar to that in Examples 1 to 6, it was confirmed that it has sufficient strength so that crack, fracture or splash is not generated in film formation by an ion plating method, although density of the sintered body is 4.80 g/cm$^3$.

In addition, in Examples 1 to 8, it was confirmed that the transparent conductive film, having composition that content of tungsten is 0.001 to 0.15, as an atomic ratio of W/(In+W), has a specific resistance of 5.0×10$^{-4}$ Ω·cm or smaller, and still more content of tungsten is 0.003 to 0.05, as an atomic ratio of W/(In+W), has a specific resistance of 3.0×10$^{-4}$ Ω·cm or smaller.

On the contrary, in Comparative Examples 1 and 2, because content of tungsten is 0.0005 or 0.17, outside a range of 0.001 to 0.15, as an atomic ratio of W/(In+W), specific resistance is over 5.0×10$^{-4}$ Ω·cm, although the oxide sintered bodys having a similar structure and texture as in Examples 1 to 8 were obtained, therefore it becomes difficult to be applied to a surface electrode of a solar cell.

In addition, in Comparative Example 3, different from Examples 1 to 8, the oxide sintered body was prepared by using mixed powder composed of the whole amount of indium oxide and the whole amount of tungsten oxide weighed, as it is, without performing calcination or the like. Accordingly, the oxide sintered body contains only the crystal grain (B) composed of the indium oxide phase, where tungsten is present as a solid solution, and the crystal grain (C) composed of the In$_6$WO$_{12}$ phase of the indium tungstate compound, without containing the crystal grain (A) composed of the indium oxide phase with a bixbyite type structure, where tungsten does not make a solid solution, therefore the oxide sintered body has insufficient strength, although having density of the sintered body equivalent to that of Examples 1 to 7, thus generating crack, fracture or splash in film formation by an ion plating method.

The oxide sintered bodies of Examples 9 to 13 contains the indium oxide as a main component, and tungsten as an additive element, and still more contains, as the additive element, at least one or more kinds of a metal element (M element) selected from a metal element group consisting of titanium, zirconium, hafnium, and molybdenum, wherein content of tungsten being 0.006 to 0.10, as an atomic ratio of W/(In+W M), content of the M element being 0.006 to 0.12, as an atomic ratio of M/(In +W+M), and a total content of tungsten and the M element is 0.012 to 0.15, as an atomic ratio of (W+M)/(In+W+M). Even in the oxide sintered body added with the M element, other than tungsten, in this way, similarly as in Examples 1 to 7, because of being composed of at least the crystal grain (A) composed of the indium oxide phase with a bixbyite type structure, where tungsten does not make a solid solution, at least the crystal grain (B) composed of the indium oxide phase with a bixbyite type structure, where tungsten is present as a solid solution, and the crystal grain (C) composed of the In$_6$WO$_{12}$ phase of the indium tungstate compound, a low density of around 70% of theoretical density and strength are both satisfied, resulting in no generation of crack, fracture or splash in film formation by an ion plating method.

In Examples 14 and 15, density of the oxide sintered body is at the vicinity of the lower limit and the upper limit of the allowable range of the present invention, that is 3.4 to 5.5 g/cm$^3$, however, also in this case, it was confirmed that crack, fracture or splash is not generated in film formation by an ion plating method, and has sufficient strength.

On the contrary, in Comparative Examples 4 and 5, density of the oxide sintered bodies was outside the allowable range of the present invention, therefore by reason that density was too low and thus strength was insufficient, or density was too high and thus weak in heat shock, or the like, crack, fracture or splash is generated on the tablet in film formation by an ion plating method.

In addition, in Examples 16, although tungsten oxide powder having a relatively large average particle diameter of 4 µm was used as raw material powder, and still more mixing time by the roll mill, in obtaining the primary mixed powder or the secondary mixed powder, was shortened as compared with Examples 1 to 8, the resultant oxide sintered body contained the crystal grain (D) composed of the tungsten oxide phase other than the crystal grain (A) composed of the indium oxide phase with a bixbyite type structure, where tungsten does not make a solid solution, the crystal grain (B) composed of the indium oxide phase with a bixbyite type structure, where tungsten is present as a solid solution, and the crystal grain (C) composed of the In$_6$WO$_{12}$ phase of the indium tungstate compound. It was confirmed that the crystal grain (D) composed of the tungsten oxide phase has substantially no problem because of no generation of crack, fracture or splash in film formation by an ion plating method, although it decreases film formation speed a little in film formation by an ion plating method.

TABLE 1

| | W/(In + W) (atomic ratio) | M element | W/(In + W + M) (atomic ratio) | W/(In + W + M) (atomic ratio) | (A) | (B) | (C) | (D) | sintered body density (g/cm³) | crack, fracture, splash | film specific resistance (×10⁻⁴ Ω·cm) |
|---|---|---|---|---|---|---|---|---|---|---|---|
| Example 1 | 0.006 | — | — | — | ○ | ○ | ○ | — | 4.84 | None | 2.5 |
| Example 2 | 0.018 | — | — | — | ○ | ○ | ○ | — | 4.96 | None | 2.4 |
| Example 3 | 0.001 | — | — | — | ○ | ○ | — | — | 4.78 | None | 3.5 |
| Example 4 | 0.003 | — | — | — | ○ | ○ | — | — | 4.82 | None | 2.9 |
| Example 5 | 0.05 | — | — | — | ○ | ○ | ○ | — | 4.99 | None | 3.0 |
| Example 6 | 0.10 | — | — | — | ○ | ○ | ○ | — | 4.96 | None | 4.0 |
| Example 7 | 0.15 | — | — | — | ○ | ○ | ○ | — | 4.91 | None | 4.8 |
| Example 8 | 0.006 | — | — | — | ○ | ○ | ○ | — | 4.80 | None | 2.6 |
| Example 9 | — | Ti | 0.006 | 0.006 | ○ | ○ | ○ | — | 4.90 | None | 2.7 |
| Example 10 | — | Ti | 0.10 | 0.05 | ○ | ○ | ○ | — | 4.98 | None | 4.9 |
| Example 11 | — | Zr | 0.006 | 0.006 | ○ | ○ | ○ | — | 4.88 | None | 2.8 |
| Example 12 | — | Hf | 0.006 | 0.006 | ○ | ○ | ○ | — | 4.86 | None | 2.8 |
| Example 13 | — | Ti, Mo | 0.006 | 0.012 | ○ | ○ | ○ | — | 4.91 | None | 2.9 |
| Example 14 | 0.006 | — | — | — | ○ | ○ | ○ | — | 3.41 | None | 2.7 |
| Example 15 | 0.006 | — | — | — | ○ | ○ | ○ | — | 5.47 | None | 2.5 |
| Example 16 | 0.006 | — | — | — | ○ | ○ | ○ | ○ | 4.15 | None | 3.0 |
| Comparative Example 1 | 0.0005 | — | — | — | ○ | ○ | — | — | 4.70 | None | 9.3 |
| Comparative Example 2 | 0.17 | — | — | — | ○ | ○ | ○ | — | 4.89 | None | 8.2 |
| Comparative Example 3 | 0.006 | — | — | — | — | ○ | ○ | — | 4.74 | Yes | — |
| Comparative Example 4 | 0.003 | — | — | — | ○ | ○ | — | — | 3.13 | Yes | — |
| Comparative Example 5 | 0.006 | — | — | — | ○ | ○ | ○ | — | 5.88 | Yes | — |

(Note)
(A): crystal grain (A) composed of the indium oxide phase, where tungsten does not make a solid solution.
(B): crystal grain (B) composed of the indium oxide phase, where tungsten is present as a solid solution
(C): crystal grain (C) composed of the indium tungstate compound phase
(D): crystal grain (D) composed of the tungsten oxide phase

INDUSTRIAL APPLICABILITY

The present invention provides the oxide sintered body containing indium and tungsten, mainly composed of the crystal grain (A) composed of the indium oxide phase with a bixbyite type structure, where tungsten does not make a solid solution, and a crystal grain (B) composed of the indium oxide phase with a bixbyite type structure, where tungsten is present as a solid solution, and having a density of 3.4 to 5.5 g/cm³, along with the tablet for ion plating, obtained by processing the same, and thus can be used without generating crack, fracture or splash in film formation of the oxide transparent conductive film by the ion plating method. This transparent conductive film is industrially extremely useful as a surface electrode of a solar cell.

The invention claimed is:

1. An oxide sintered body comprising an indium oxide as a main component, and tungsten as an additive element, content of tungsten being 0.001 to 0.15 as an atomic ratio of W/(In+W), characterized in that said oxide sintered body is mainly composed of a crystal grain (A) composed of the indium oxide phase with a bixbyite type structure, where tungsten does not make a solid solution, and a crystal grain (B) composed of the indium oxide phase with a bixbyite type structure, where tungsten is present as a solid solution, and has a density of 3.4 to 5.5 g/cm³.

2. The oxide sintered body according to claim 1, characterized by further comprising, as the additive element, one or more kinds of a metal element (M) selected from the group consisting of titanium, zirconium, hafnium, and molybdenum, wherein a total content of tungsten and the metal element is 0.001 to 0.15, as an atomic ratio of (W+M)/(In+W+M).

3. The oxide sintered body according to claim 1, characterized in that the content of tungsten is 0.003 to 0.05, as an atomic ratio of W/(In+W).

4. The oxide sintered body according to claim 2, characterized in that the total content of tungsten and the metal element is 0.003 to 0.05, as an atomic ratio of (W+M)/(In+W+M).

5. The oxide sintered body according to claim 1, characterized by further comprising a crystal grain (C) composed of an indium tungstate compound phase.

6. The oxide sintered body according to claim 1, characterized by not comprising a crystal grain (D) composed of a tungsten oxide phase.

7. A tablet obtained by processing the oxide sintered body according to claim 6.

8. A tablet obtained by processing the oxide sintered body according to claim 1.

* * * * *